United States Patent
Yang et al.

(10) Patent No.: US 12,094,848 B2
(45) Date of Patent: Sep. 17, 2024

(54) SEMICONDUCTOR PACKAGES AND METHODS FOR FORMING THE SAME

(71) Applicant: TAIWAN SEMICONDUCTOR MANUFACTURING COMPANY, LTD., Hsinchu (TW)

(72) Inventors: Shin-Yi Yang, New Taipei (TW); Ming-Han Lee, Taipei (TW); Shau-Lin Shue, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 274 days.

(21) Appl. No.: 17/383,355

(22) Filed: Jul. 22, 2021

(65) Prior Publication Data
US 2022/0293546 A1    Sep. 15, 2022

Related U.S. Application Data

(60) Provisional application No. 63/159,067, filed on Mar. 10, 2021.

(51) Int. Cl.
| H01L 23/00 | (2006.01) |
| H01L 23/538 | (2006.01) |
| H01L 25/065 | (2023.01) |
| H01L 23/498 | (2006.01) |

(52) U.S. Cl.
CPC .......... *H01L 24/24* (2013.01); *H01L 23/5385* (2013.01); *H01L 23/5386* (2013.01); *H01L 24/19* (2013.01); *H01L 25/0655* (2013.01); *H01L 23/49816* (2013.01); *H01L 23/49833* (2013.01); *H01L 23/49838* (2013.01); *H01L 2224/24137* (2013.01)

(58) Field of Classification Search
CPC . H01L 24/24; H01L 23/5385; H01L 23/5386; H01L 24/19; H01L 25/0655; H01L 23/49816; H01L 23/49833; H01L 23/49838; H01L 2224/24137
See application file for complete search history.

(56) References Cited

U.S. PATENT DOCUMENTS

| 8,802,504 | B1 | 8/2014 | Hou et al. |
| 8,803,292 | B2 | 8/2014 | Chen et al. |
| 8,803,316 | B2 | 8/2014 | Lin et al. |
| 8,993,380 | B2 | 3/2015 | Hou et al. |
| 9,281,254 | B2 | 3/2016 | Yu et al. |
| 9,299,649 | B2 | 3/2016 | Chiu et al. |
| 9,372,206 | B2 | 6/2016 | Wu et al. |
| 9,425,126 | B2 | 8/2016 | Kuo et al. |
| 9,443,783 | B2 | 9/2016 | Lin et al. |

(Continued)

*Primary Examiner* — Fernando L Toledo
*Assistant Examiner* — Neil R Prasad
(74) *Attorney, Agent, or Firm* — NZ CARR LAW OFFICE

(57) ABSTRACT

Embodiments of the present disclosure provide an integrated circuit die having edge interconnect features. The edge interconnect features may be conductive lines extending through sealing rings and exposed on edge surfaces of the integrated circuit die. The edge interconnect features are configured to connect with other integrated circuit dies without going through an interposer. The semiconductor device may include two or more integrated circuit dies with edge interconnect features and connected through a RDL structure formed between the two or more integrated circuit dies.

20 Claims, 31 Drawing Sheets

(56) References Cited

U.S. PATENT DOCUMENTS

| | | |
|---|---|---|
| 9,496,189 B2 | 11/2016 | Yu et al. |
| 2004/0248330 A1* | 12/2004 | Kitabatake .............. H01L 24/40 |
| | | 257/E23.044 |
| 2018/0294230 A1* | 10/2018 | Dabral .................... H01L 23/58 |
| 2019/0378788 A1* | 12/2019 | Carney ............... H01L 23/3107 |
| 2021/0005563 A1* | 1/2021 | Ko ......................... H01L 24/02 |

* cited by examiner

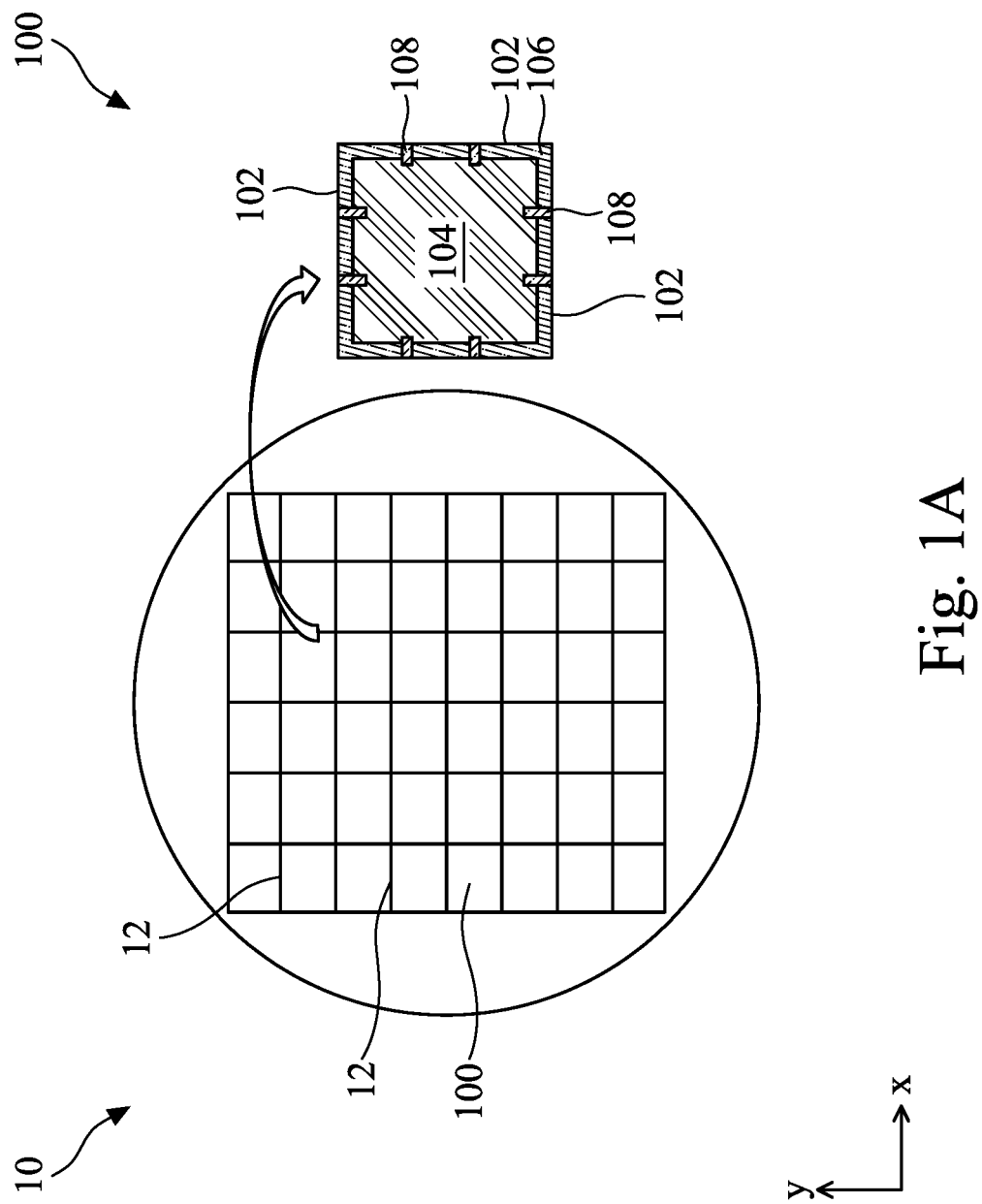

SEMICONDUCTOR PACKAGES AND METHODS FOR FORMING THE SAME

BACKGROUND

The semiconductor industry continues to improve the integration density of various electronic components (e.g., transistors, diodes, resistors, capacitors, etc.) by continual reductions in minimum feature size, which allow more components, hence more functions, to be integrated into a given area, forming integrated circuit dies. Each integrated circuit die may include many input/output pads to communicate with other components to be packaged with the integrated circuit die. Interposers are commonly used to provide input/output among two or more integrated circuit dies in a semiconductor package. However, integration density increases, connecting integrated circuit dies through interposers alone may become challenging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-1L schematically demonstrate an integrated circuit die having edge interconnect features according to embodiments of the present disclosure.

DETAILED DESCRIPTION

Figure 1B:
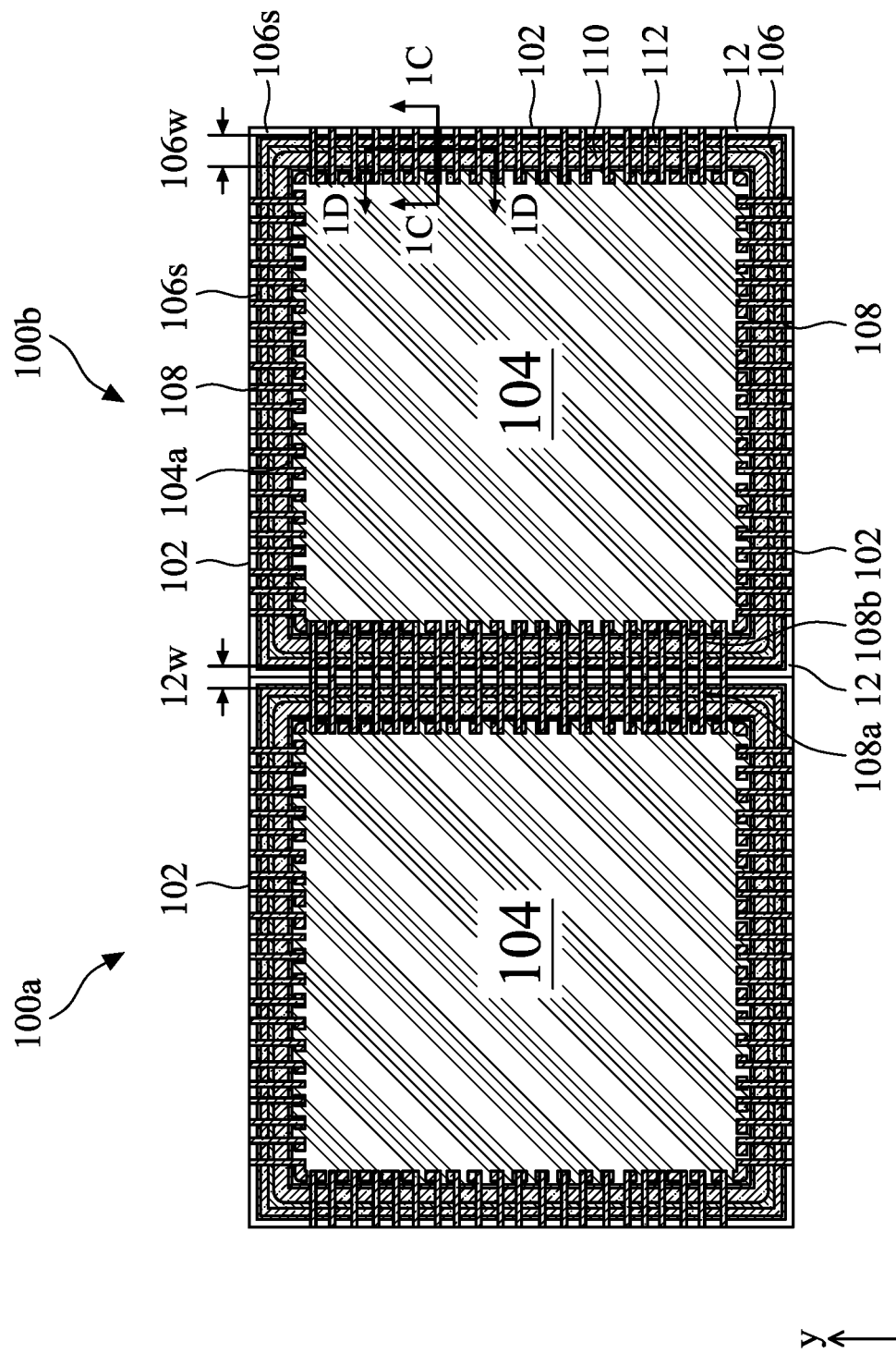

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed herein may be discussed in a specific context, namely a package structure (e.g., a package on package (PoP) structure) including dies bonded together with a hybrid bonding technique. The dies can be bonded together face-to-face (F2F) or face-to-back (F2B). For example, in a F2F bonding configuration the active surfaces (faces) of the dies are bonded together, whereas in a F2B bonding configuration, an active surface of one die is bonded to a back surface of another die. In addition, the hybrid bonding between the dies includes a dielectric-to-dielectric bonding and a metal bonding. For example, by including a solder bonding (instead of, for example, copper to copper bonding), the bonding temperature of the hybrid bonding can be lowered significantly.

Further, the teachings of this disclosure are applicable to any package structure including one or more semiconductor dies. Other embodiments contemplate other applications, such as different package types or different configurations that would be readily apparent to a person of ordinary skill in the art upon reading this disclosure. It should be noted that embodiments discussed herein may not necessarily illustrate every component or feature that may be present in a structure. For example, multiples of a component may be omitted from a figure, such as when discussion of one of the components may be sufficient to convey aspects of the embodiment. Further, method embodiments discussed herein may be discussed as being performed in a particular order; however, other method embodiments may be performed in any logical order.

Embodiments of the present disclosure provide an integrated circuit die having edge interconnect features. The edge interconnect features may be conductive lines extending through sealing rings and exposed on edge surfaces of the integrated circuit die. The edge interconnect features are configured to connect with another integrated circuit die without going through an interposer. The semiconductor device may include two or more integrated circuit dies with edge interconnect features and connected through an inter-chip redistribution layer (RDL) formed between the two or more integrated circuit dies. In some embodiments, the inter-chip redistribution layer (RDL) may be formed by patterning and selective metal bumping processes during packaging.

Figure 1C:
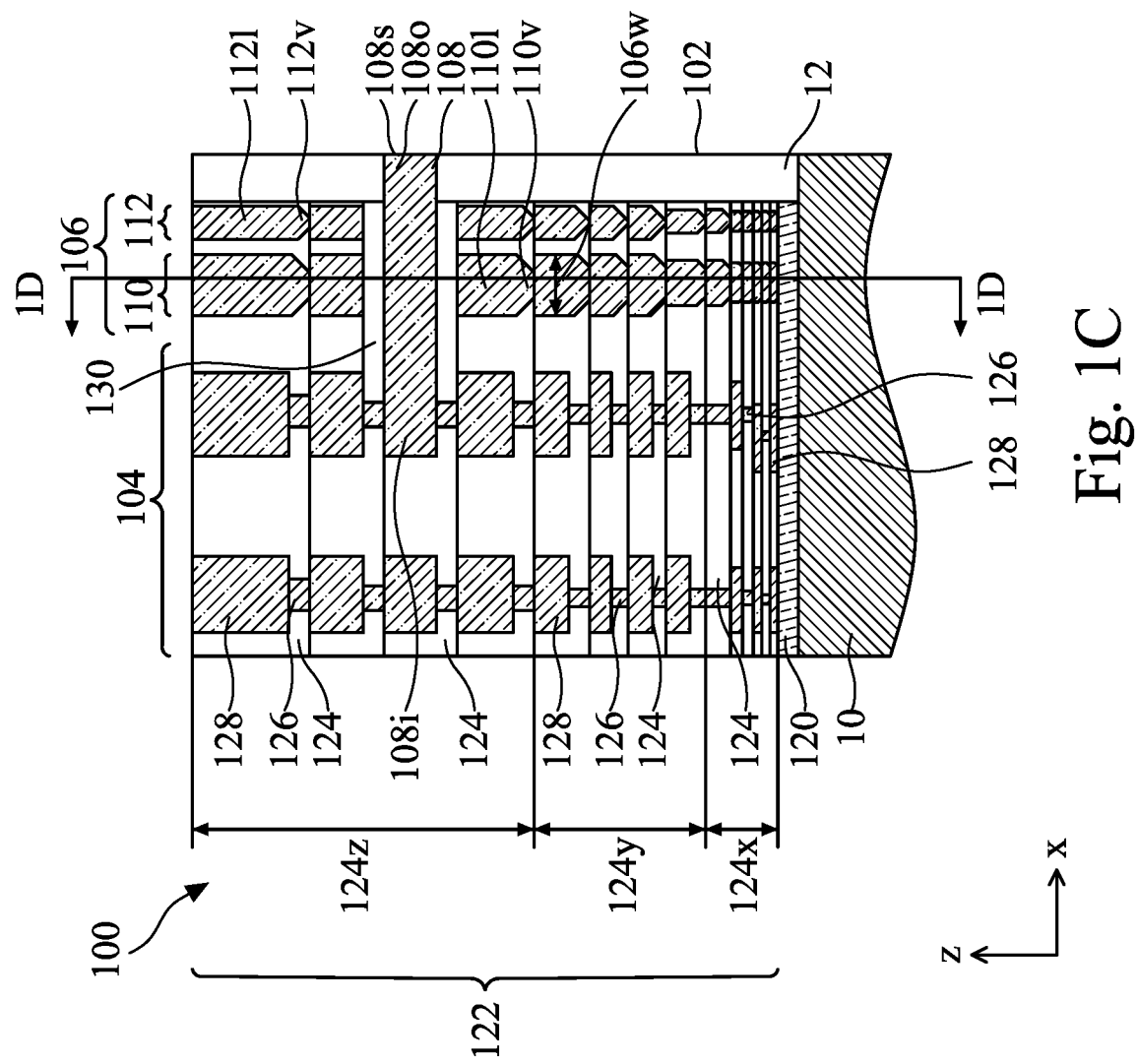
Figure 1D:
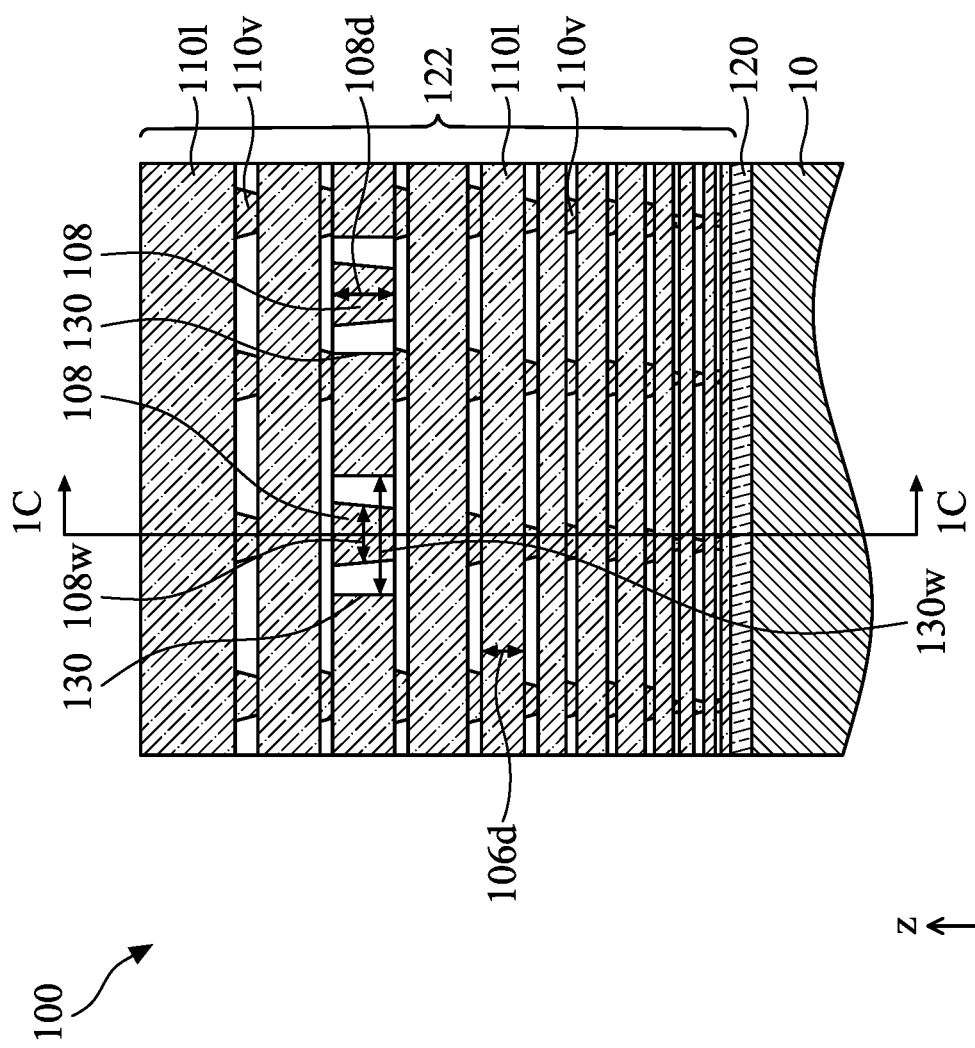
Figure 1E:
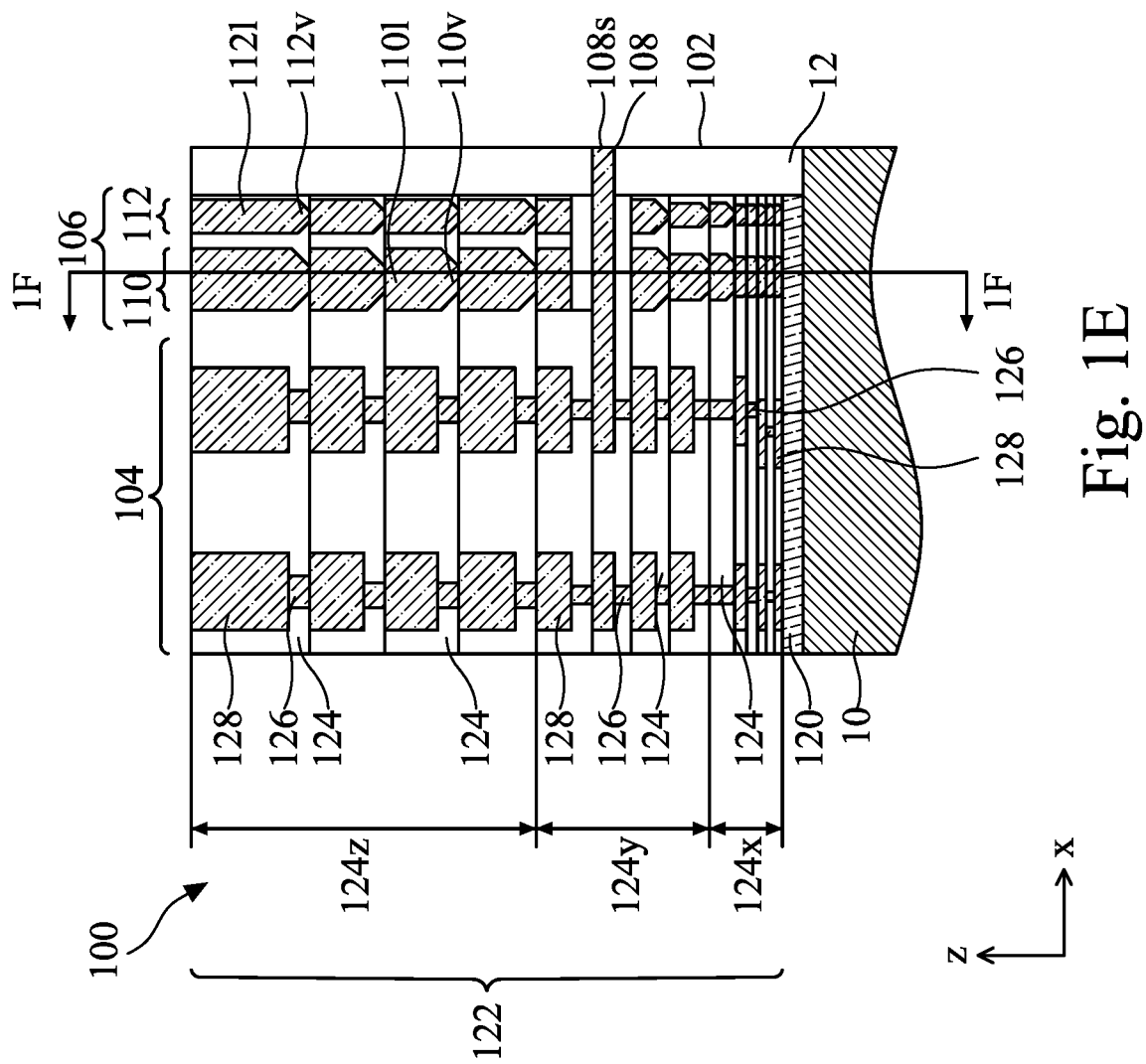
Figure 1F:
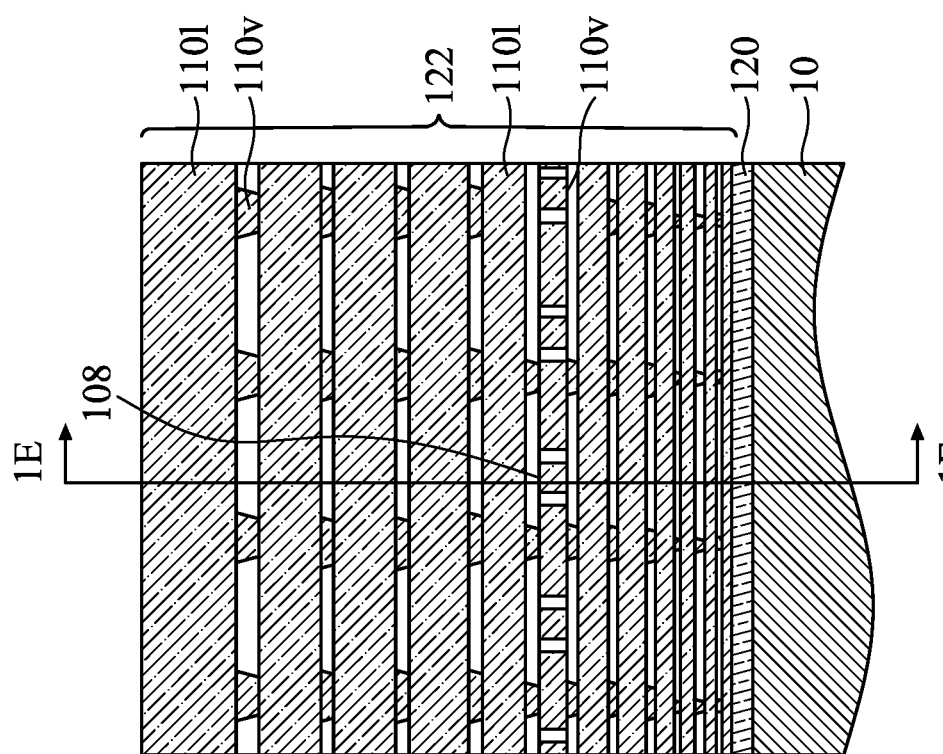
Figure 1G:
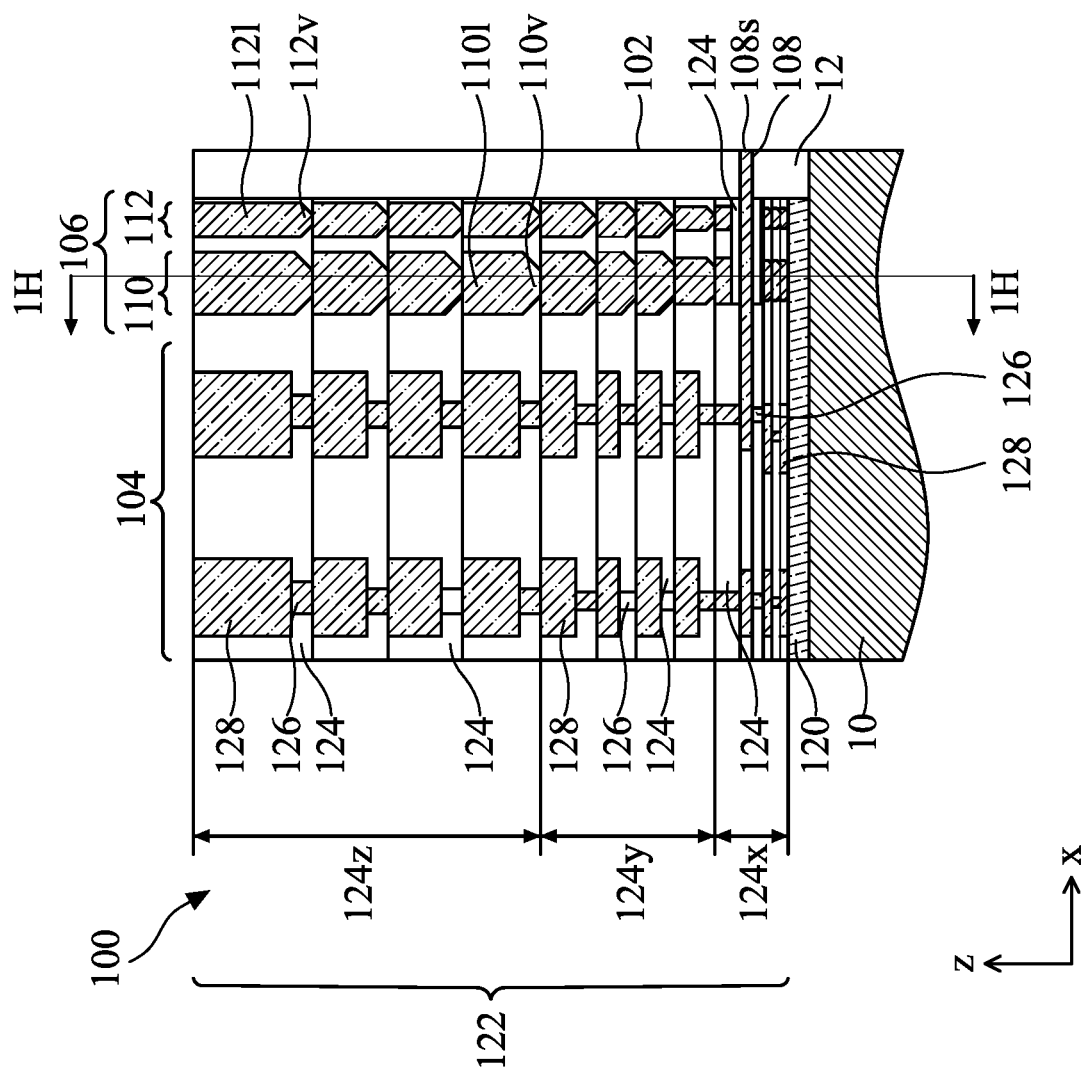
Figure 1H:
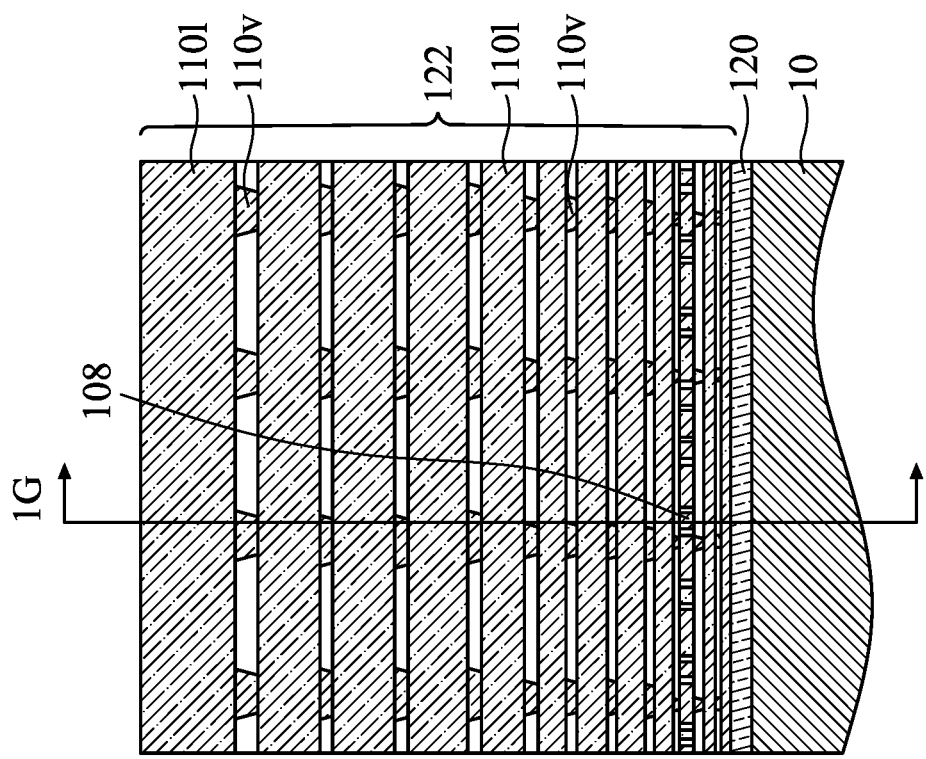

FIGS. 1A-1L schematically demonstrate an integrated circuit die having edge interconnect features according to embodiments of the present disclosure. FIG. 1A is a schematic plan view of a substrate including an array of integrated circuit dies according to the present disclosure. FIG. 1B is a schematic plan view of one integrated circuit die 100 (100a, 100b) according to the present disclosure. FIG. 1C is an enlarged partial sectional view of the integrated circuit die 100 along the line 1C-1C in FIG. 1B. FIG. 1D is an enlarged partial sectional view of the integrated circuit die 100 along the line 1D-1D in FIG. 1C.

As shown in FIG. 1A, an array of integrated circuit dies (or chiplets) 100 are formed on a substrate 10. The array of integrated circuit dies 100 are separated from each other by two sets of intersecting scribe lines 12. One set of scribe lines 12 extend along the x-direction and a second set of scribe lines 12 extend along the y-direction. The array of integrated circuit dies 100 are formed in and/or on the substrate 10 within an array of areas defined by the scribe lines 12. After fabrication, the integrated circuit dies 100, may be tested and cut out along the scribe lines 12 to individual integrated circuit dies 100 for subsequent processing, such as packaging.

As shown in FIG. 1A, each of the integrated circuit die 100 may include a circuit region 104 surrounded by a seal region 106. According to embodiments of the present disclosure, the integrated circuit die 100 includes one or more edge interconnect features 108 extending from the circuit region 104 through the seal region 106 into the scribe line 12. In some embodiments, the edge interconnect features 108 may be conductive lines intersecting with the scribe lines 12 surrounding the integrated circuit die 100. After the integrated circuit die 100 is cut out along the scribe lines 12, the edge interconnect features 108 are exposed on cutting surfaces 102 of the integrated circuit die 100. The edge interconnect features 108 may be conductive lines configured to connect with external contacts formed on the cutting surfaces 102 to provide signal and/or power supplies. In some embodiments, the edge interconnect features 108 may be symmetrically arranged across all scribe lines 12 around the integrated circuit die 100.

The substrate 10 may be a semiconductor substrate, for example, bulk silicon, doped or undoped, or an active layer of a semiconductor-on-insulator (SOI) substrate. The semiconductor substrate may include other semiconductor material, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as a multi-layered or gradient substrate may also be used.

The array of integrated circuit dies 100 may be formed in and/or on the substrate 10 by performing various semiconductor fabrication processes, including, but not limited to, front-end-of-line (FEOL) processing, and back-end-of-line (BEOL) processing. The various semiconductor fabrication processes are performed to form a device layer 120 (FIGS. 1C and 1D) and an interconnect structure 122 (FIGS. 1C and 1D) in the integrated circuit dies 100.

In some embodiments, the array of integrated circuit dies 100 have substantially identical circuit designs. In other embodiments, the array of integrated circuit dies 100 may include two or more different circuit designs formed on the same substrate 10. The integrated circuit dies 100 may be designed to perform any suitable function. For example, the integrated circuit die 100 may be a logic die (e.g., central processing unit, a SoC, ASIC, FPGA, microcontroller, etc.), a memory die (e.g., a DRAM die, a Wide I/O die, etc), a memory cube (e.g., HBM, HMC, etc.), a high data rate transceiver die, an I/O interface die, an integrated passive device die (e.g., an IPD die), a power management die (e.g., a PMIC die), an RF die, a sensor die, an MEMS die, signal processing dies (e.g., a DSP die), a front-end die (e.g., an AFE dies), a monolithic 3D heterogeneous chiplet stacking die, the like, or a combination thereof.

FIG. 1B is a schematic plan view of two neighboring integrated circuit dies 100a, 100b according to the present disclosure formed on the substrate 10. In FIG. 1B, components formed in various layers along the z-axis are superimposed on one another to show their relative positions in plan view. Positions of the components along the z-axis are shown corresponding cross-sectional views, such as the views in FIGS. 1C and 1D. FIG. 1B illustrates relative positions of the circuit region 104, the seal region 106, and the edge interconnect features 108 within the integrated circuit dies 100 according to some embodiments. As shown in FIG. 1B, each integrated circuit die 100 is defined in a square area by the scribe lines 12. In some embodiments, the integrated circuit dies 100 may have a plan view area in a range between about 10 mm$^2$ and about 1000 mm$^2$ depending on the circuit design and/or function of the integrated circuit die 100. FIG. 1B illustrates integrated circuit dies with a square shape in the plan view. However, the integrated circuit dies may have other shapes in the plan view. For example, rectangular, hexagonal, octagonal shapes may be used to achieve design purposes. Depending on the design, the scribe lines 12 may have a width 12w in a range between about 1 μm to about 200 μm. A scribe line width 12w lower than 1 μm may not be wide enough to tolerant system errors during separation of the integrated circuit dies 100. A scribe line width 12w greater than 200 μm would increase cost of production without additional benefit.

Within the die area of each integrated circuit die 100, the circuit region 104 is surrounded by the seal region 106 around an outer perimeter of the circuit region 104. One or more sealing rings 110, 112 are concentrically formed in the seal region 106. The seal rings 110, 112 provide protection to circuit structures in the circuit region 104 against undesired elements from the exterior environment, such as water vapor, during and after separation of the integrated circuit dies 100.

Even though two sealing rings 110, 112 are shown in the integrated circuit die 100, less or more sealing rings may be included in the seal region 106. After being cut along the scribe lines 12, the portion of the scribe line 12 may remain on sides of the integrated circuit die 100, and the seal region 106 is surrounded by materials of the scribe lines 12 and not exposed on the cutting surfaces 102.

The edge interconnect features 108 are two or more conductive lines extending from the circuit region 104 through the seal region to intersect with the scribe lines 12. In some embodiments, the edge interconnect features 108 may intersect with the corresponding scribe line 12 at a substantially perpendicular manner. In other embodiments, the edge interconnect features 108 may intersect with the corresponding scribe line 12 at a slanted angle. For example, the edge interconnect features 108 may intersect the y-z plan at a slanted angle, such as an angle in a range between about 45 degree to about 90 degree. In some embodiments, the edge interconnect features 108 may be distributed along one or more of sides 106s of the seal region 106. In some embodiments, the edge interconnect features 108 are a plurality of conductive lines distributed along one or more of the sides 106s. In some embodiments, the plurality of conductive lines may be evenly distributed along one or more sides 106s of the seal region 106.

In some embodiments, as shown in FIG. 1B, the edge interconnect features 108 may be symmetrically arranged along all sides 106s of the seal region 106. For example, an equal number of the edge interconnect features 108 are distributed alone every sides 106s of the seal region 106 at a substantially equal pitch. The symmetrical distribution allow corresponding edge interconnect features 108 in neighboring integrated circuit dies 100 to form continuous conductive lines. As shown in FIG. 1B, edge interconnect features 108a of the integrated circuit die 100a are in contact with corresponding edge interconnect features 108b of the integrated circuit die 100a to form a plurality of continuous conductive lines across the shared scribe line 12. Similarly, the edge interconnect features 108a along other sides 106s of the seal region 106 may form continuous line features with corresponding edge interconnect features 108 in the neighboring integrated circuit die 100 along the other sides 106s.

In some embodiments, the edge interconnect features 108a of the integrated circuit die 100a and the corresponding edge interconnect features 108b of the integrated circuit die 100b are fabricated as monolithic conductive lines. The monolithic conductive line arrangement may enable direct communication between devices in the neighboring integrated circuit dies, and thus, allowing the neighboring integrated circuit dies to be packaged together without cutting from the scribe lines. The monolithic conductive line arrangement also provides higher tolerance to the cutting operation and ensures that the edge interconnect features 108 are exposed on the cutting surface 102.

In other embodiments, the edge interconnect features 108a of the integrated circuit die 100a and the corresponding edge interconnect features 108b of the integrated circuit die 100b are fabricated as two segments separated by material filled in the scribe line 12 therebetween. The segmented conductive line arrangement provides more design flexibility. For example, neighboring integrated circuit dies may have edge interconnect features at different layers, at different placements, and/or of different densities.

The continuous line features ensure that the edge interconnect features 108 are exposed on the cutting surfaces 102 for subsequent wiring and packaging process after the integrated circuit die 100 is cut free from the substrate 10. The symmetrical arrangement of the edge interconnect features 108 also provide design flexibilities. For example, a common scheme of edge interconnect feature arrangement may be used for different integrated circuit dies, such as for different SoCs, and different memory dies. It should be noted that the edge interconnect features 108 may be arranged in any suitable manner to achieve desired design proposes.

FIGS. 1C and 1D provide additional details of the edge interconnect features 108 within the integrated circuit die 100 according to embodiments of the present disclosure. FIG. 1C is an enlarged partial sectional view of the integrated circuit die 100 across the seal region. FIG. 1D is an enlarged partial sectional view of the integrated circuit die 100 along the sealing ring 110.

As shown in FIGS. 1C and 1D, the device layer 120 is formed in and/or on the substrate 10, and the interconnect structure 122 are formed over the device layer 120. The device layer 120 may include various semiconductor devices, such as transistors, diodes, capacitors, resistors, etc., and may be formed in and/or on the substrate 10. In some embodiments, the device layer 120 includes one or more dielectric layers overlying the semiconductor devices therein.

The interconnection structure 122 includes various conductive features, such as a first plurality of conductive features 126 and second plurality of conductive features 128, and one or more intermetal dielectric (IMD) layers 124 to separate and isolate various neighboring conductive features 126, 128. In some embodiments, the first plurality of conductive features 126 are conductive vias and the second plurality of conductive features 128 are conductive lines. The interconnection structure 122 includes multiple levels of the conductive features 128, and the conductive features 128 are arranged in each level to provide electrical paths to the devices in the device layer 120. The conductive features 126 provide vertical electrical routing from the device layer 120 to the conductive features 128, and between the conductive features 128 in different layers.

The conductive features 126 and conductive features 128 may be made from one or more electrically conductive materials, such as one or more layers of graphene, metal, metal alloy, metal nitride, or silicide. For example, the conductive features 126 and the conductive features 128 are made from copper, aluminum, aluminum copper alloy, titanium, titanium nitride, tantalum, tantalum nitride, titanium silicon nitride, zirconium, gold, silver, cobalt, nickel, tungsten, tungsten nitride, tungsten silicon nitride, platinum, chromium, molybdenum, hafnium, other suitable conductive material, or a combination thereof.

The IMD layers 124 may be formed, for example, of a low dielectric constant (low-K) dielectric material, such as SiOx, SiOxCyHz, SiO$_x$C$_y$, SiCx, SiNx, or related low-k dielectric material, compounds thereof, composites thereof, combinations thereof, or the like. The IMD layers 124 may be formed by any suitable method, such as spinning, chemical vapor deposition (CVD), and/or plasma-enhanced CVD (PECVD). In some embodiments, the interconnect structure 122 may be formed sequentially layer-by-layer from the device layer 120 during BOEL processing. In some embodiments, the interconnect structure 122, the conductive features 126 and conductive features 128 may be fabricated using damascene and/or dual-damascene process.

As shown in FIG. 1C, a plurality of IMD layers 124 are sequentially formed over the device layer 120 with the conductive features 126, 128 having increased dimension. The number of IMD layers 124 may be any number suitable for the circuit design. For example, the number of IMD layers 124 may be between 1 and 30. In FIG. 1C, the IMD layers 124 are divided into three groups: bottom IMD layers 124x, middle IMD layers 124y, top IMD layers 124z based on relative position to the device layer 120. The bottom IMD layers 124x, formed immediately on the device layer 120 are thinner and with the conductive features 126, 128 of a higher density. The middle IMD layers 124y formed over the bottom IMD layers 124x are thicker and with the conductive features 126, 128 of a lower density. The top IMD layers 124z formed over the middle IMD layers 124y are thickest and with the conductive features 126, 128 of a lowest density.

The sealing rings 110, 112 are formed in the seal region 106 between the circuit region 104 and the scribe line 12. Each of the sealing rings 110, 112 includes physically connected components to function as a barrier between the conductive features 126, 128 in the interconnect structure 122 and exterior environment, such as moisture. The sealing rings 110, 112 may be formed by any suitable designs and with any suitable materials, such as materials suitable as moisture barrier. In some embodiments, the sealing rings 110, 112 are formed with electrically conductive materials. In some embodiments, the sealing rings 110, 112 may be electrically grounded. In some embodiments, the sealing rings 110, 112 may be formed from the same material as the conductive features 126, 128. For example, the sealing rings 110, 112 may be formed from Cu, Al, Co, Ru, Mo, W, and related alloys.

FIGS. 1C and 1D schematically demonstrate one example of the sealing rings 110, 112. Other sealing ring structures may be used by persons skilled in the art with the integrated circuit die 100 according to present disclosure. As shown in FIGS. 1C and 1D, each of the sealing rings 110, 112 includes layers of substantially continuous sealing lines 110*l*, 112*l* connected by a plurality of sealing vias 110*v*, 112*v* formed in the IMD layers 124. The continuous sealing lines 110*l*, 112*l* in neighboring IMD layers 124 are connected by the plurality of sealing vias 110*v*, 112*v* respectively. The sealing lines 110*l*, 112*l* and sealing vias 110*v*, 112*v* may be fabricated layer-by-layer in the same process with the conductive features 126, 128 in the corresponding IMD layers 124. Dimension of the sealing lines 110*l*, 112*l* may vary in different IMD layers 124. In some embodiments, the sealing lines 110*l*, 112*l* may have a line width 106*w* in a range between about 0.01 μm and about 6 μm, and a line depth 106$d$ in a range between about 0.01 μm and about 6 μm.

The edge interconnect features 108 may be formed in one or more IMD layers 124. Each of the edge interconnect features 108 may be conductive line having an inner end 108$i$ and an outer end 108$o$. The inner end 108$i$ may be electrically connected to one or more conductive features 128, 126 in the circuit region 104. The outer end 108$o$ is embedded in the scribe line 12 outside the seal region 106. In some embodiments, a portion of the edge interconnect features 108 may be dummy connectors to achieve structural uniformity in the integrated circuit die 100. For example, the inner end 108$i$ of a portion of the edge interconnect features 108 may be "floating" in the IMD layer 124 without connecting to any other conductive features, such as conductive features 126, 128. After the integrated circuit die 100 is cut out, the outer ends 108$o$ of the edge interconnect features 108 is exposed on the cutting surface 102.

The edge interconnect features 108 extend through the sealing rings 110, 112 through openings 130 which are formed in the sealing ring 110, 112 and the corresponding IMD layer 124. Dielectric material of the IMD layer 124 is disposed between the edge interconnect features 108 and the sealing rings 110, 112 to electrically isolate the edge interconnect features 108 from the sealing rings 110, 112.

The edge interconnect features 108 may be formed in the same process with the conductive features 126, 128 in the corresponding IMD layers 124. In some embodiments, the sealing rings 110, 112 may be formed from the same material as the conductive features 126, 128. For example, the edge interconnect features 108 may be formed from Cu, Al, Co, Ru, Mo, W, and related alloys. In some embodiments, a barrier film, not shown, may be formed around the edge interconnect features 108. The barrier film may be formed from one or more layers of nitride material, such as titanium nitride, tantalum nitride, tungsten nitride, molybdenum nitride, or other related nitrides, such as titanium silicon nitride, tungsten silicon nitride, or other suitable material.

In some embodiments, dimensions of the edge interconnect features 108 may be similar to the conductive features 128 in the same IMD layer 124. In some embodiments, the edge interconnect features 108 may have a line width 108$w$ in a range between about 0.01 μm and about 6 μm, and a line depth 108$d$ in a range between about 0.01 μm and about 6 μm. A width 130$w$ of the openings 130 may be in a range between about 0.03 μm and about 18 μm.

Dimension of the edge interconnect features 108 may vary in different IMD layers 124. Depending on the function and density of the edge interconnect features 108, the edge interconnect features 108 may be formed in the bottom IMD layers 124$x$, the middle IMD layers 124$y$, the top IMD layers 124$z$, and a top metal layer (not shown) above the top IMD layer 124$z$. For example, if the edge interconnect features 108 are used to transfer signals to individual devices in the device layer 120, the density of the edge interconnect features 108 is likely to be relatively high and the width of the edge interconnect features 108 may be relatively small, and the edge interconnect features 108 may be formed in one or more bottom IMD layers 124$x$. If the edge interconnect features 108 are used to provide power supply to the device layer 120, the density of the edge interconnect features 108 is likely to be relatively low and the width of the edge interconnect features 108 may be relatively large, and the edge interconnect features 108 may be formed in one or more top IMD layers 124$z$.

In some embodiments, the scribe lines 12 between the integrated circuit dies 100 may also be filled with suitable materials. A dielectric material may be filled in the scribe lines 12 between the integrated circuit dies 100. The outer end 108$o$ of the edge interconnect features 108 are surrounded by the dielectric material in the scribe lines 12, thus, are electrically isolated from one another. In some embodiments, the scribe lines 12 may be filled with the same material as in the IMD layers 124. The scribe lines 12 may be filled and then patterned layer-by-layer in the same process with the conductive features 126, 128 in the corresponding IMD layers 124. In some embodiments, the scribe lines 12 or the dielectric material filled in the scribe lines 12 may include one or more layers of a low dielectric constant (low-K) dielectric material, such as SiOx, SiOxCyHz, SiO$_x$C$_y$, SiCx, SiNx, or related low-k dielectric material, compounds thereof, composites thereof, combinations thereof, or the like.

In the embodiment shown in FIGS. 1C and 1D, the edge interconnect features 108 are formed in the top IMD layer 124$z$. As discussed above, the edge interconnect features 108 according to the present disclosure may be formed in any suitable IMD layers. In the embodiment shown in FIGS. 1E and 1F, the edge interconnect features 108 are formed in the middle IMD layer 124$y$. In the embodiment shown in FIGS. 1G and 1H, the edge interconnect features 108 are formed in the bottom IMD layer 124$x$.

Figure 1I:
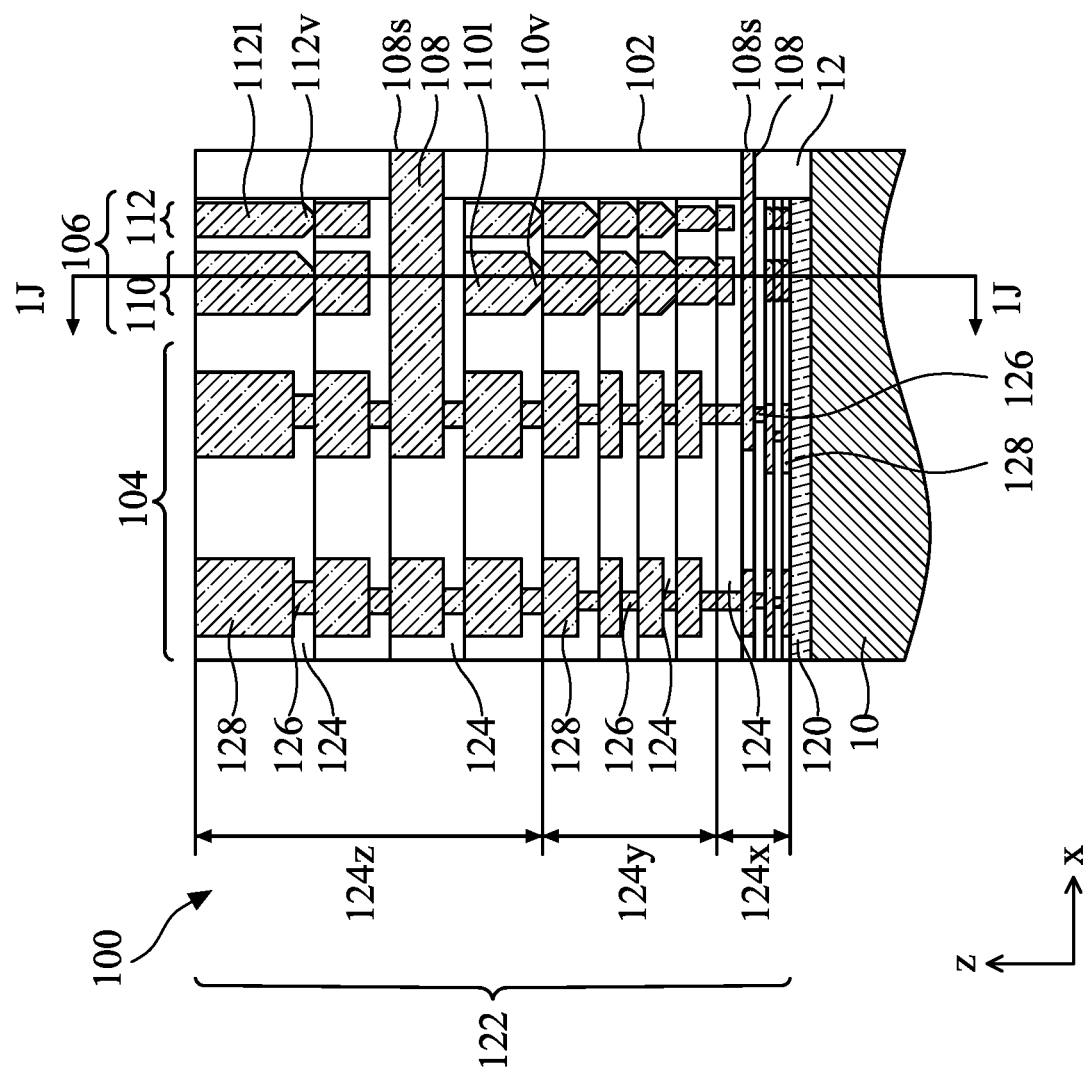
Figure 1J:
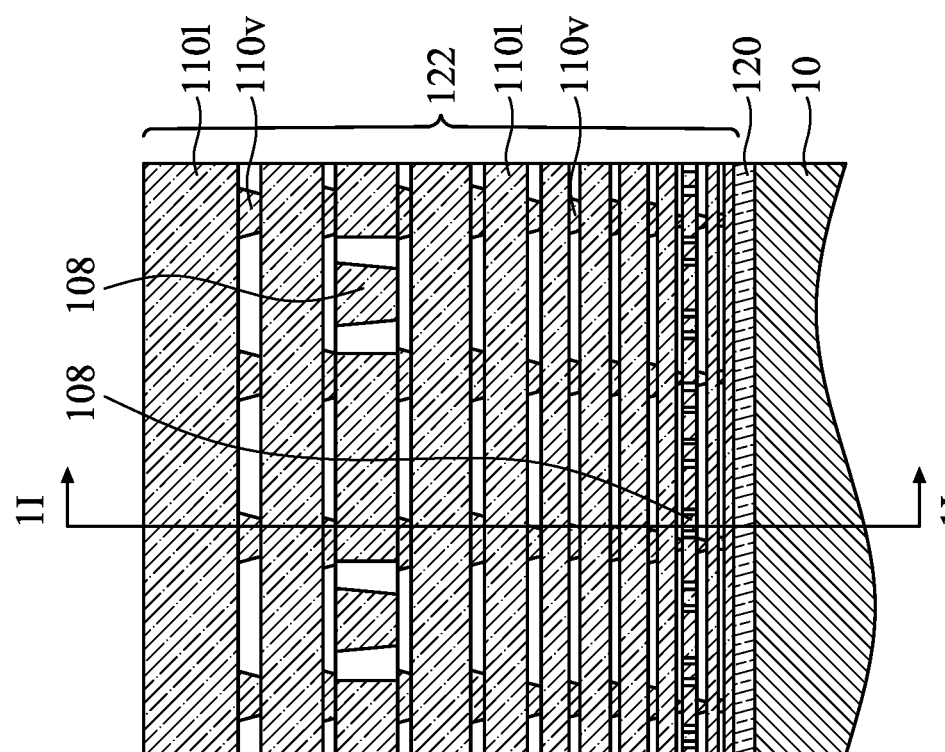

In the embodiment shown in FIGS. 1I and 1J, the edge interconnect features 108 are formed in two or more IMD layers 124. Particularly, in FIGS. 1I and 1J, the edge interconnect features 108 are formed in one of the bottom IMD layer 124$x$ and in one of the top IMD layer 124$z$. It should be noted that the edge interconnect features 108 may be formed in any combination of IMD layers 124.

In some embodiments, the edge interconnect features 108 may be formed in a top metal layer, which may be the topmost layer of the IMD layer 124 or a metal layer immediately under an under-bump metallization (UBM) structure. In the embodiment shown in FIGS. 1L and 1K, the edge interconnect features 108 are formed in the top metal layer.

Figure 1K:
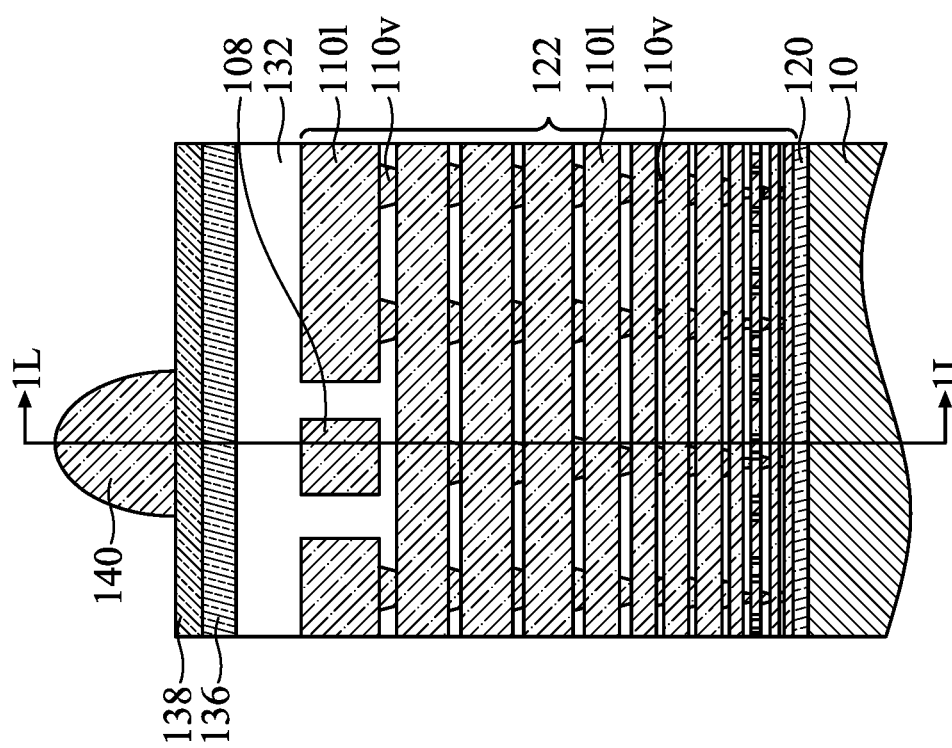
Figure 1L:
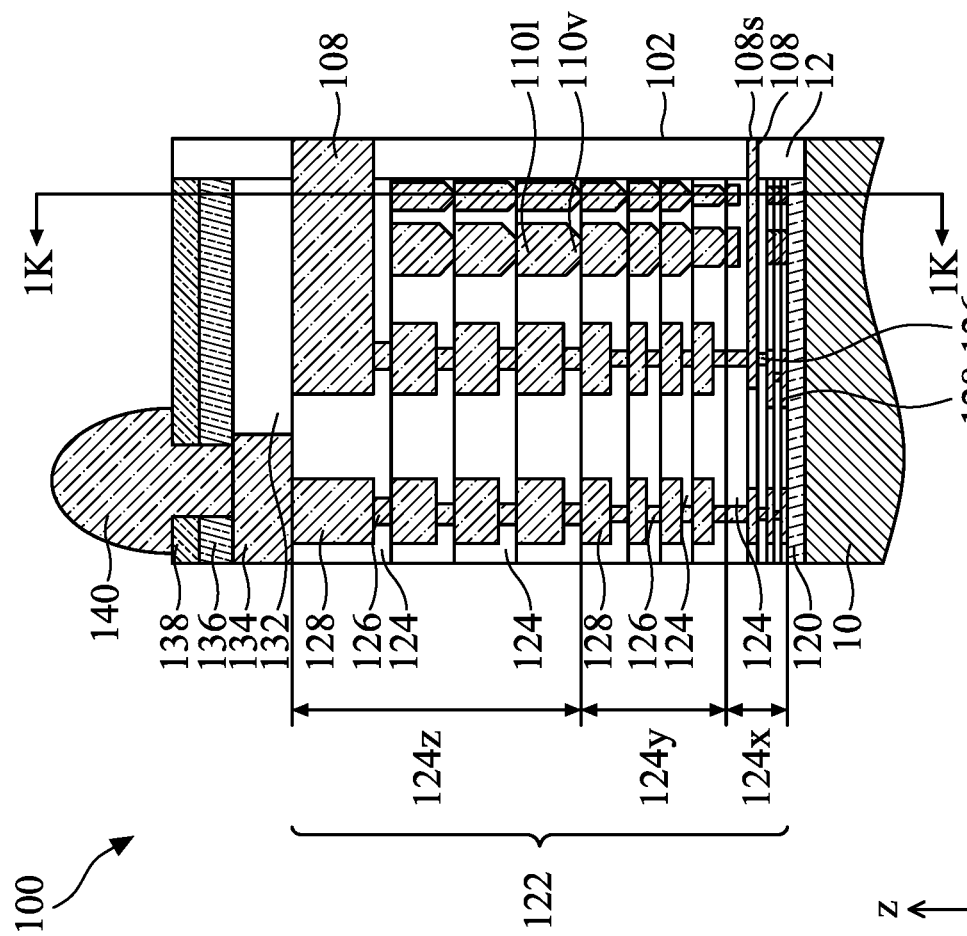

As shown in FIG. 1L, a dielectric layer 132 is formed over the topmost IMD layer 124. One or more contact pads 134 are formed on the interconnect structure 122 to electrically connect the metal lines or vias inside the IMD layers 124. In some embodiments, the contact pads 134 may be formed of aluminum, aluminum copper, aluminum alloys, copper, copper alloys, or the like. A passivation layers, such as a first passivation layer 136 and a second passivation layer 138 are formed over the dielectric layer 132 and patterned to expose portions of the contact pads 134 respectively. In some embodiments, the first passivation layer 136 is formed of a dielectric material, such as undoped silicate glass (USG), silicon nitride, silicon oxide, silicon oxynitride or a non-porous material by any suitable method, such as CVD, PVD, or the like. The second passivation layer 138 may be a polymer layer, such as an epoxy, polyimide, benzocyclobutene (BCB), polybenzoxazole (PBO), or the like, although other relatively soft, often organic, dielectric materials can also be used. Bumps 140 are formed on the corresponding contact pads 134. The bump 140 can be a spherical bump or a pillar bump formed of a conductive material including at least one of solder, Cu, Ni or Au.

As shown in FIGS. 1L and 1K, the edge interconnect features 108 may be formed in the top metal layer and to provide connection to the devices in the device layer 120 in electrical communication with the bumps 140.

FIGS. 2, 3A-3E, 4A-4B, 5A-5E, 6A-6B, 7A-7B, 8, and 9 schematically demonstrate various stages of forming a semiconductor package 300 according to embodiments of the present disclosure. The semiconductor package 300 includes two or more integrated circuit dies having edge interconnect features according to the present disclosure.

Figure 2:
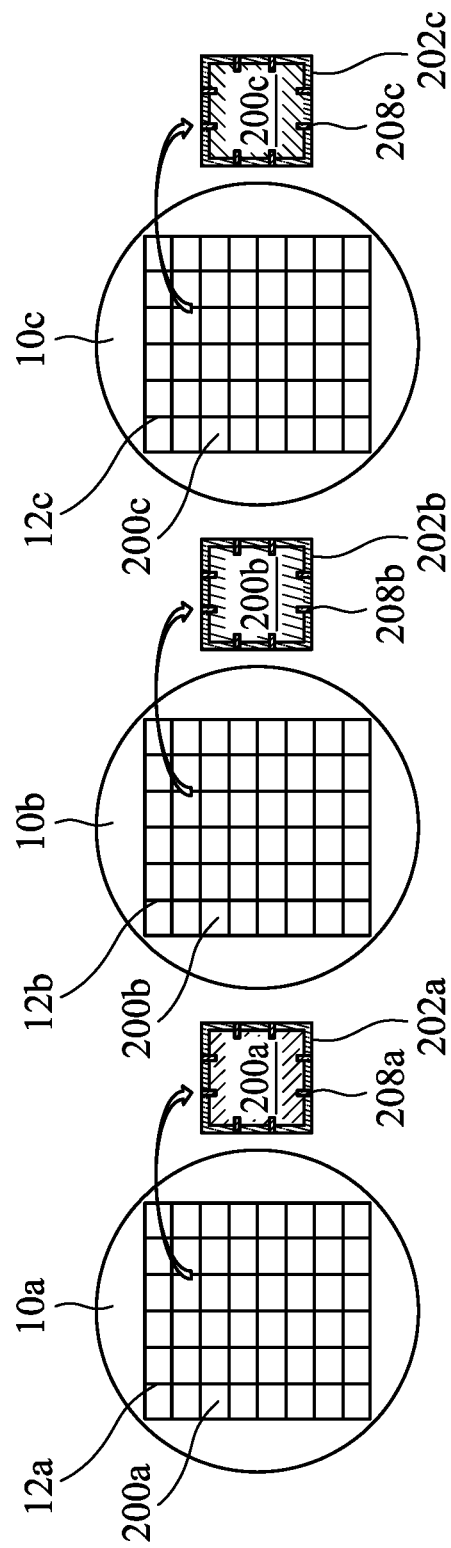
FIGS. 2, 3A-3E, 4A-4B, 5A-5E, 6A-6B, 7A-7B, 8, and 9 schematically demonstrate various stages of forming a semiconductor package according to embodiments of the present disclosure.
Figure 3A:
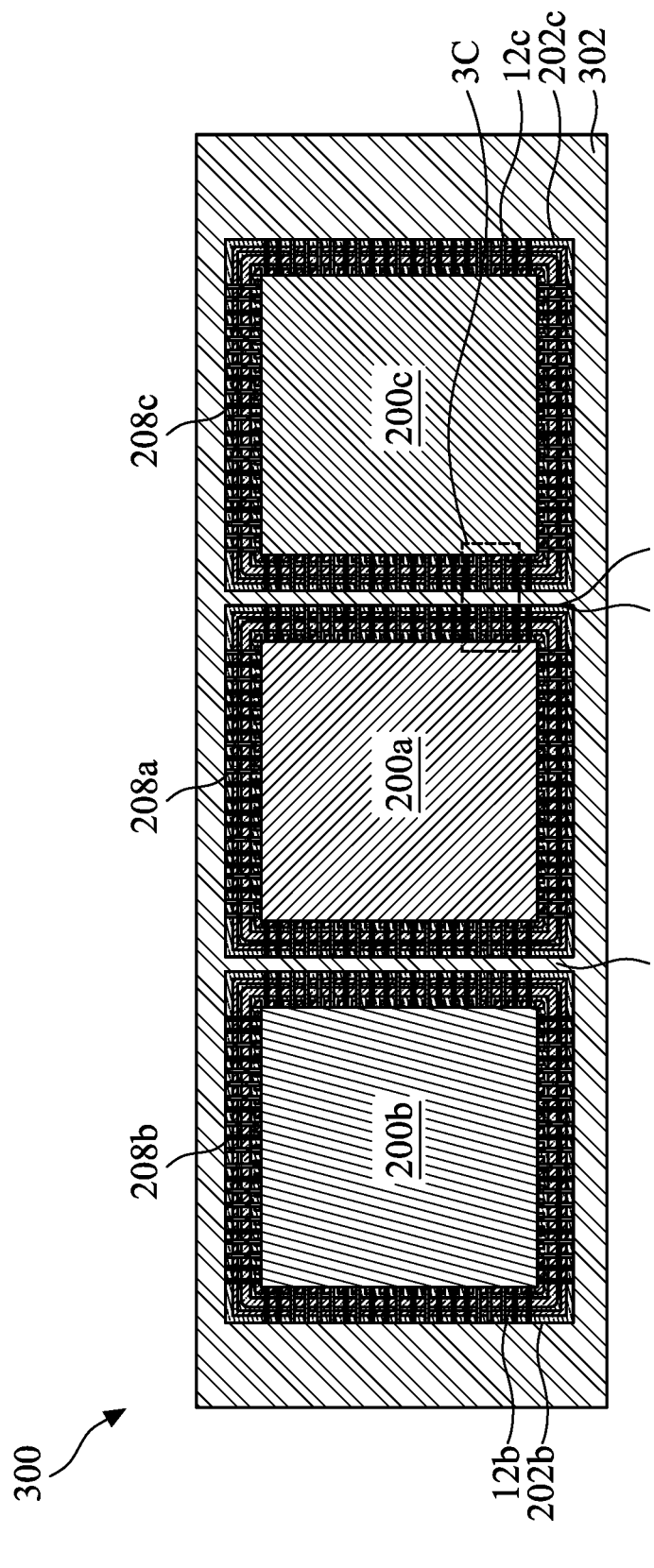
Figure 3B:
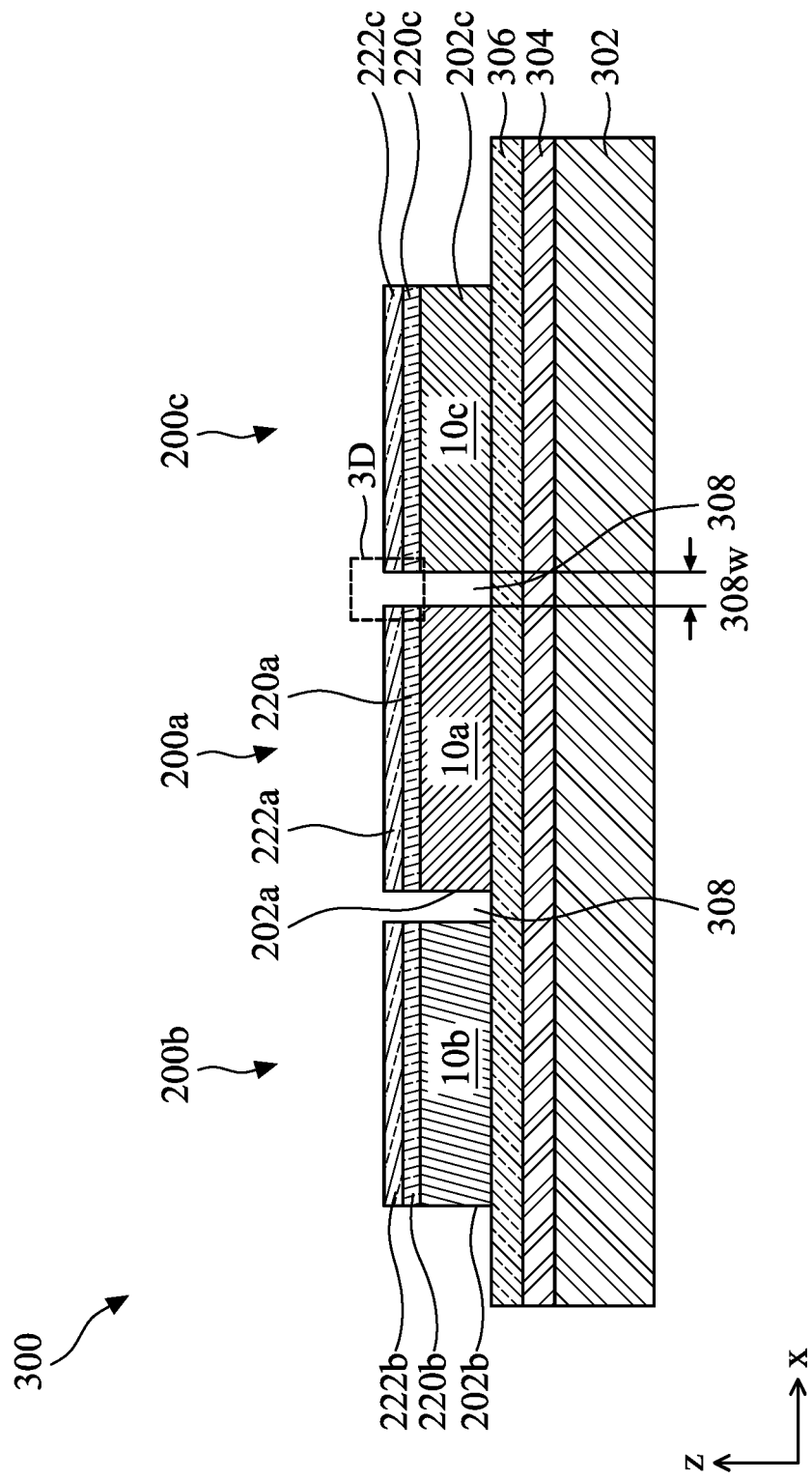
Figure 3C:
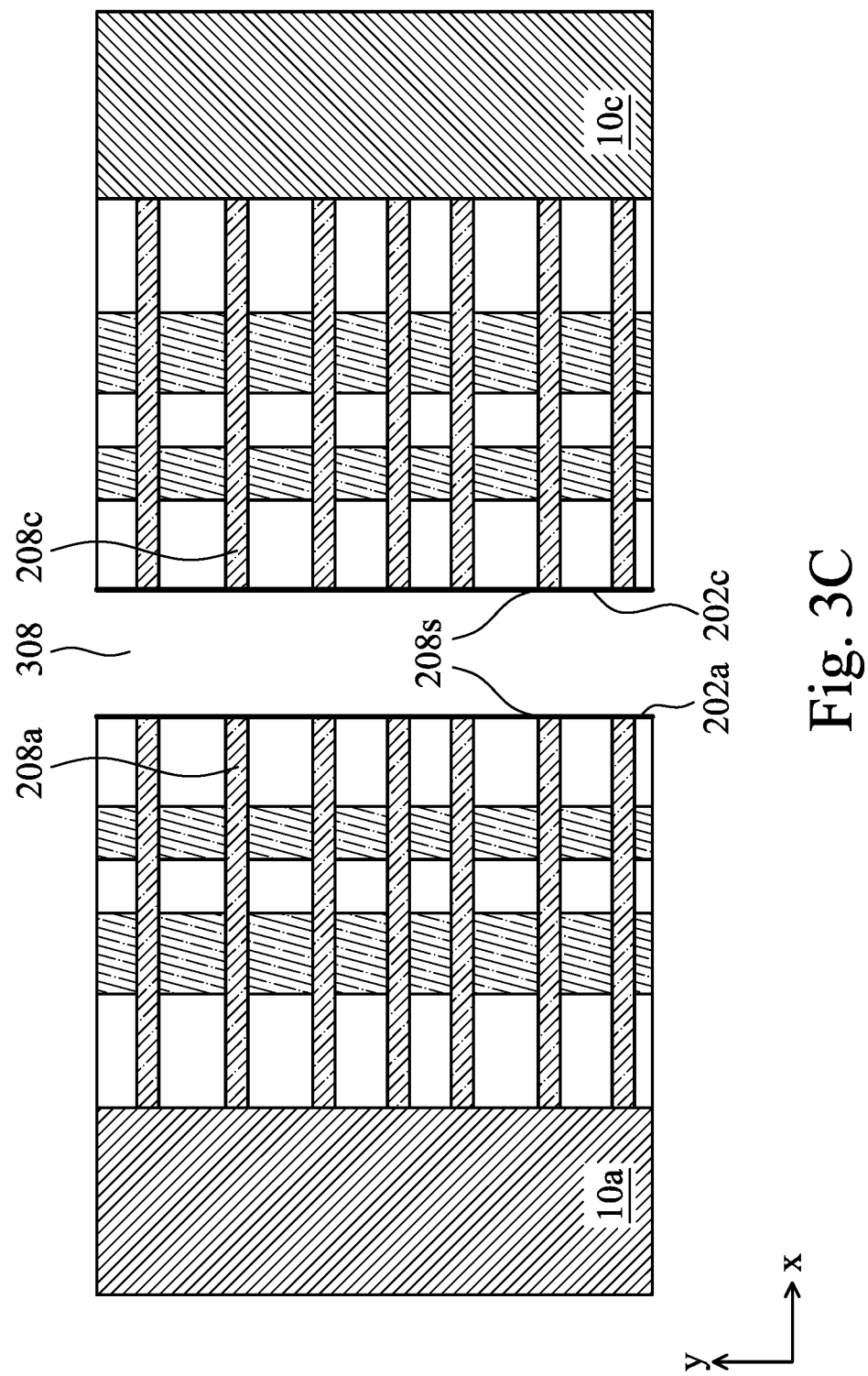
Figure 3D:
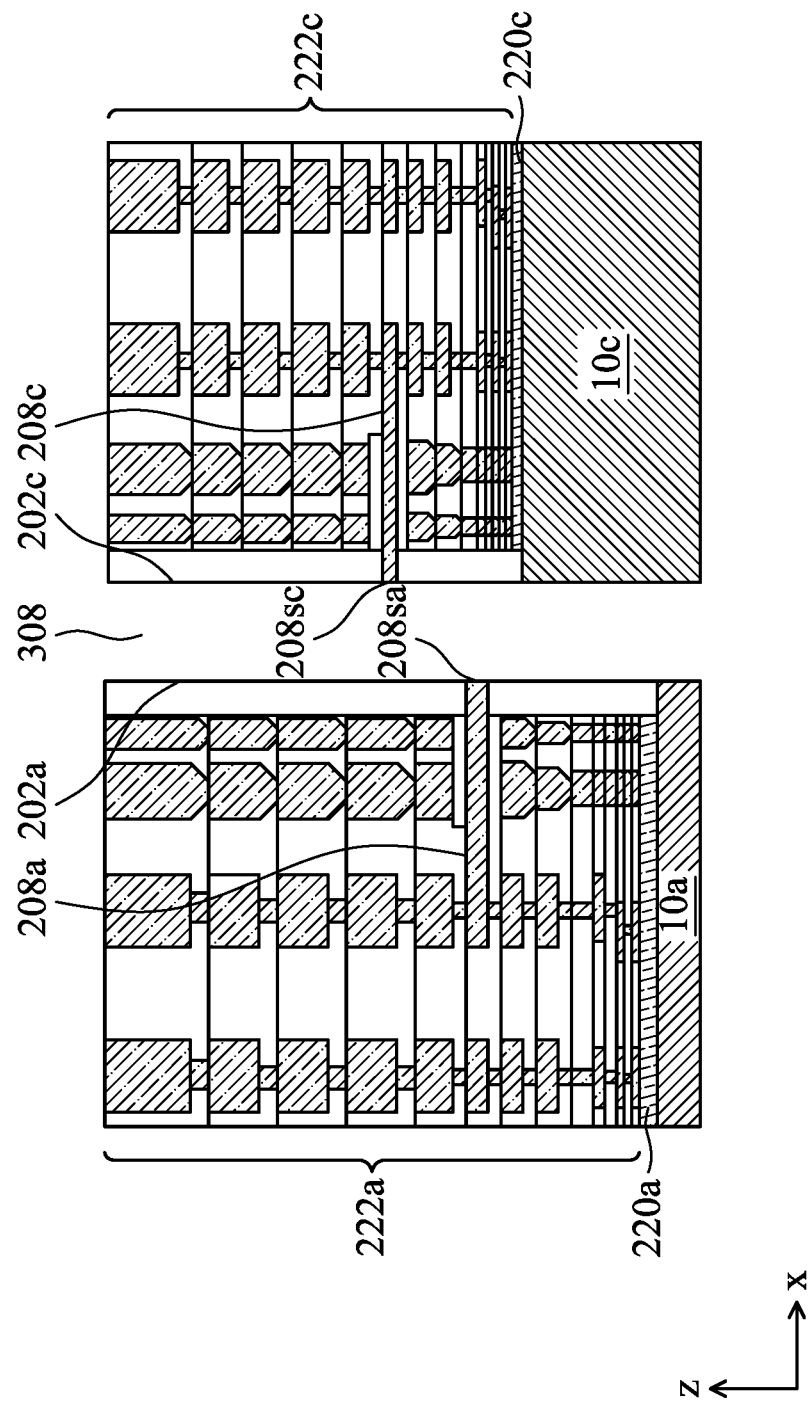
Figure 3E:
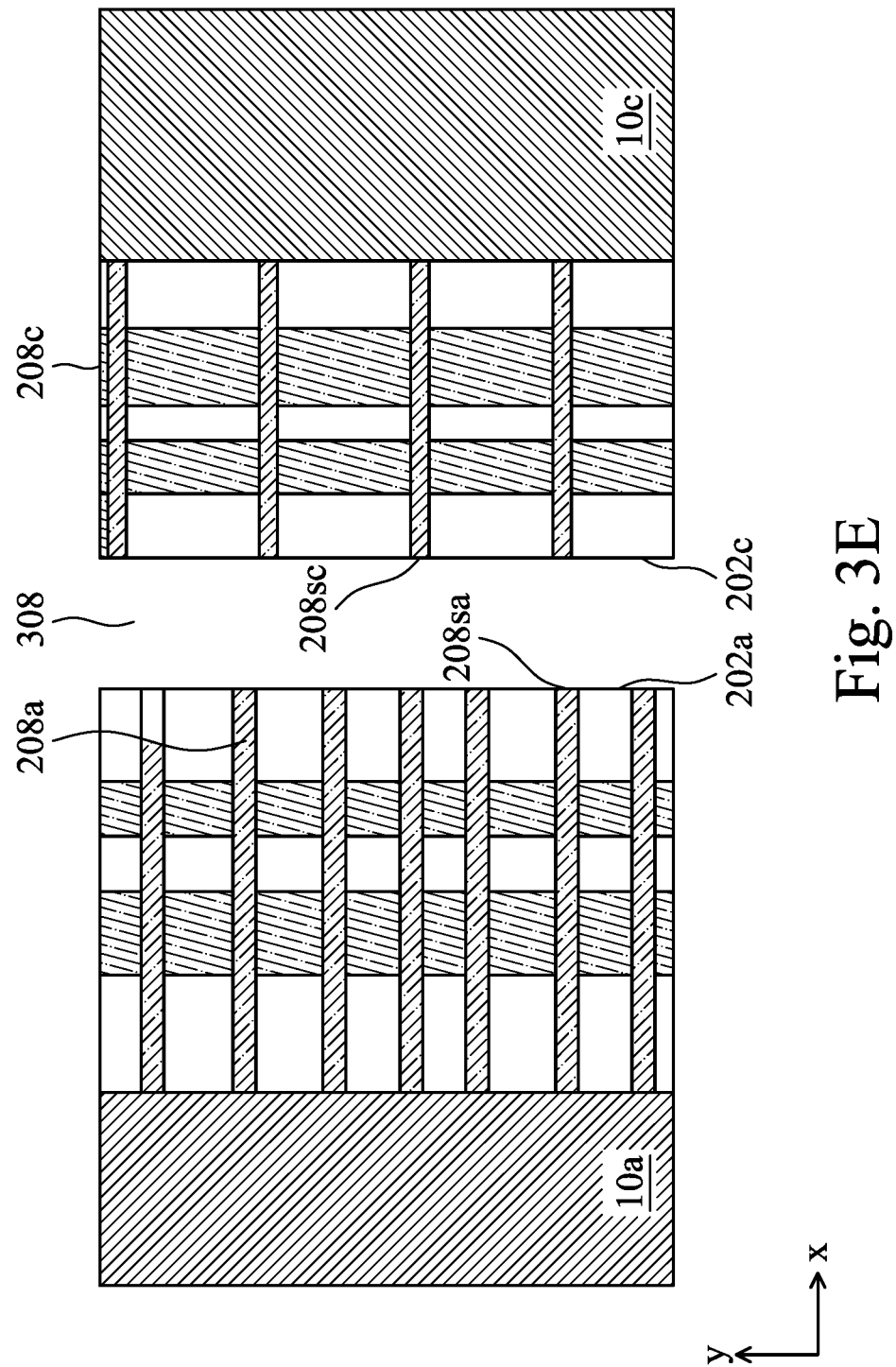

FIG. 2 is schematic plan views of substrates 10a, 10b, 10c having integrated circuit dies 200a, 200b, 200c formed thereon. FIG. 3A is a schematic plan view of the semiconductor package 300. FIG. 3B is a schematic cross-sectional view of the semiconductor package 300. FIG. 3C is a partial enlarged view of the area 3C in FIG. 3A. FIG. 3D is a partial enlarged view of the area 3D in FIG. 3B. FIG. 3E is a partial enlarged view of the area 3C in FIG. 3A in an alternative arrangement.

As shown in FIG. 2, the integrated circuit dies 200a, 200b, 200c may be fabricated separately on different substrates 10a, 10b, 10c. Alternatively, some or all of the integrated circuit dies 200a, 200b, 200c may be fabricated on the same substrate.

In some embodiments, the integrated circuit dies 200a, 200b, 200c may include any suitable circuit designs to achieve different functions. For example, each of the integrated circuit dies 200a, 200b, 200c may be a system on a chip (SOC) or a system on integrated circuit (SOIC) die; a memory die, such as a static random-access memory (SRAM) die, a dynamic random-access memory (DRAM) die, a high bandwidth memory (HBM) die, or the like; a passive device die, such as a multilayer ceramic chip (MLCC) capacitor die, an integrated passive device (IPD) die, an integrated voltage regulator (IVR) die, the like, or a combination thereof; a logic die; an analog die; a microelectromechanical system (MEMS) die, a radio frequency (RF) die, or a combination thereof.

In some embodiments, the integrated circuit dies 200a, 200b, 200c may be different types of dies to be connected together. For example, the integrated circuit die 200a may be a SOC die and the integrated circuit dies 200b and 200c may be memory dies, such as a HBM die and a DRAM die. In other embodiments, the integrated circuit dies 200a, 200b, 200c may be different types of SOC dies. More or less number of integrated circuit dies may be packaged together to achieve desired function.

Similar to the integrated circuit die 100 described in FIGS. 1A-1K, each of the integrated circuit dies 200a, 200b, 200c may include a device layer 220a, 220b, 220c formed in and/or on the substrate 10a, 10b, 10c, and an interconnect structure 222a, 222b, 222c formed on the device layer 220a, 220b, 220c (shown in FIG. 3B). The interconnect structures 222a, 222b, 222c are similar to the interconnect structure 122 of the integrated circuit die 100. Similar to the integrated circuit die 100, each of the integrated circuit die 200a, 200b, 200c further includes one or more edge interconnect features 208a, 208b, 208c extending from the interconnect structures 222a, 222b, 222c into scribe lines 12a, 12b, 12c on the corresponding substrate 10a, 10b, 10c. After the integrated circuit dies 200a, 200b, 200c are fabricated and cut into individual dies, the edge interconnect features 208a, 208b, 208c are exposed on corresponding cutting surfaces 202a, 202b, 202c. As shown in FIGS. 3C and 3D, cross-sectional surfaces 208sa, 208sc (collectively 208s) of the edge interconnect features 208a, 208c are exposed on the cutting surfaces 202a, 202c.

As shown in FIGS. 3A and 3B, the integrated circuit dies 200a, 200b, 200c are attached to a carrier substrate 302. In some embodiments, an adhesive layer 304 is formed on the carrier substrate 302, and a die attach film 306 is formed on the adhesive layer 304. The integrated circuit dies 200a, 200b, 200c are attached on the die attach film 306. The carrier substrate 302 may be a glass carrier substrate, a ceramic carrier substrate, or the like. In some embodiments, multiple semiconductor packages can be formed on the carrier substrate 302 simultaneously.

The adhesive layer 304 is placed on the carrier substrate 302 to assist in the adherence of overlying structures, for example, the integrated circuit dies 200a, 200b, 200c. In some embodiments, the adhesive layer 304 may comprise a light to heat conversion (LTHC) material or an ultra-violet glue, although other types of adhesives, such as pressure sensitive adhesives, radiation curable adhesives, epoxies, combinations of these, or the like, may also be used. The adhesive layer 304 may be placed onto the carrier substrate 302 in a semi-liquid or gel form, which is readily deformable under pressure. In other embodiments, the adhesive layer 304 may be an ultra-violet (UV) glue, which loses its adhesive property when exposed to UV lights.

The die attach film 306 may be placed on the adhesive layer 304 to assist in the attachment of the integrated circuit dies 200a, 200b, 200c to the adhesive layer 304. In some embodiments, the first die attach film 306 may be an epoxy resin, a phenol resin, acrylic rubber, silica filler, or a combination thereof, and is applied using a lamination technique. The die attach film 306 may be dispensed as a liquid and cured, may be a laminate film laminated onto the carrier substrate 302, or may be the like. In some embodiments, the top surface of the die attach film 306 may be leveled and may have a high degree of coplanarity. However, any other suitable alternative material and method of formation may alternatively be utilized.

As shown in FIG. 3B, the integrated circuit dies 200a, 200b, 200c are placed onto the die attach film 306. The integrated circuit dies 200a, 200b, 200c may be placed using, e.g., a pick and place process, in a face-up orientation. However, any suitable method of placing the integrated circuit dies 200a, 200b, 200c onto the die attach film 306 may also be utilized.

In some embodiments, the integrated circuit dies 200a, 200b, 200c may be placed onto the carrier substrate 302 so that the edge interconnect features 208a, 208b, 208c are positioned to facilitate connections by an inter-chip RDL. As shown in FIG. 3A, the integrated circuit dies 200a, 200b, 200c may be placed so that one of the cutting surfaces 202a, 202b, 202c in each of the integrated circuit dies 200a, 200b, 200c faces one of the cutting surfaces 202a, 202b, 202c of the integrated circuit dies 200a, 200b to be connected. In FIG. 3A, the integrated circuit dies 200b, 200a, 200c are positioned in a linear arrangement so that the edge interconnect features 208a of the integrated circuit die 200a are to be connected with the edge interconnect features 208b of the integrated circuit die 200b and the edge interconnect features 208c of the integrated circuit die 200c.

The integrated circuit dies 200a, 200b, 200c are placed on the carrier substrate 302 with a gap 308 between the cutting surfaces 202a, 202b, 202c of the integrated circuit dies 200a, 200b, 200c to be connected. The gap 308 may have a distance 308w between the cutting surfaces 202a, 202b, 202c. In some embodiments, the distance 308w may be in arrange between about 1 μm and about 400 μm. A distance less than 1 μm may not be wide enough to properly form and pattern a dielectric layer in between. A distance greater than 400 μm may increase device footprint without additional benefit.

The inter-chip RDL to be formed according to the present disclose provide additional design flexibility and/or fabrication error toleration so that the edge interconnect features 208a, 208b, 208c to be connected may be disposed in the different levels, arranged in different intervals, and/or aligned in a staggered manner, or designed by different protocols and to be connected in a crisscross manner. FIG. 3C schematically illustrates the alignment between the edge interconnect features 208a of the integrated circuit die 200a and the edge interconnect features 208c of the integrated circuit die 200c in the x-y plane. In the embodiment shown in FIG. 3C, the edge interconnect features 208a, 208c of the integrated circuit die 200a, 200c may have substantially the same spacing. In some embodiments, the edge interconnect features 208a, 208b, 208c in the integrated circuit dies 200a, 200b, 200c are arranged in the same pattern, i.e. arranged in substantially the same intervals so that the edge interconnect features 208a, 208b, 208c may be connected with one another by a plurality of parallel conductive lines in the subsequent packaging processes.

However, the edge interconnect features 208a, 208c to be connected do not have to have the same spacing, substantially aligned, or even following the same protocol. For example, the edge interconnect features 208a, 208b, 208c to be connected may be positioned at different levels along the z-direction, as shown FIG. 3D, which illustrates that the edge interconnect features 208a of the integrated circuit die 200a and the edge interconnect features 208c of the integrated circuit die 200c are in different levels in the z-direction. In other embodiments, the edge interconnect features 208a, 208b, 208c in the integrated circuit dies 200a, 200b, 200c are arranged in the different pattern, i.e. arranged in substantially the different intervals so that the edge interconnect features 208a, 208b, 208c may be connected with one another in the subsequent packaging processes, as shown in FIG. 3E.

Referring FIG. 3B, an optional dielectric layer (not shown) may be formed between the die attach film 306 and the integrated circuit dies 200a, 200b, 200c. One or more metallization patterns are formed on or in the dielectric layer to form a redistribution structure, such as redistribution structure formed on a backside of the substrate 10a, 10b, 10c.

Figure 4A:
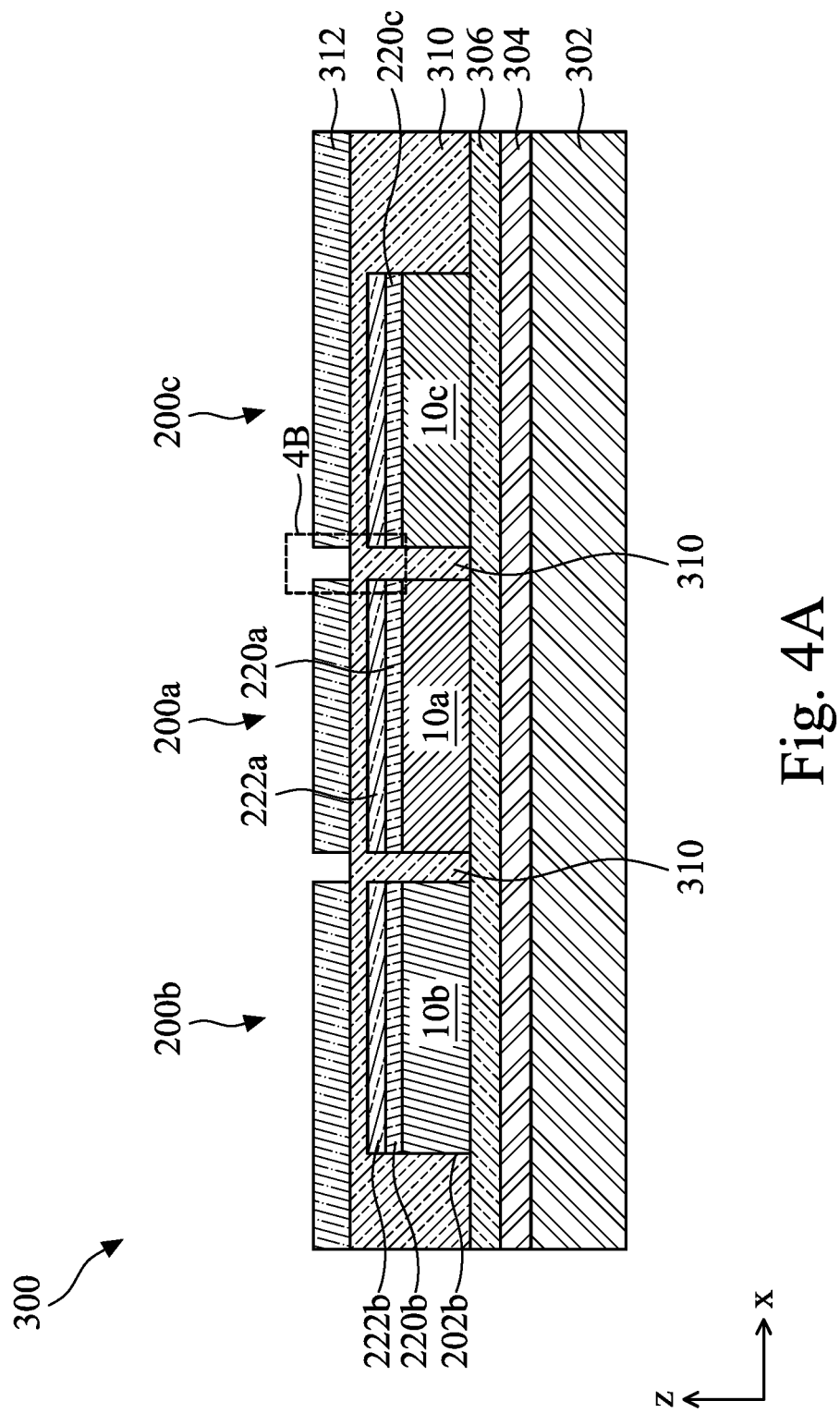
Figure 4B:
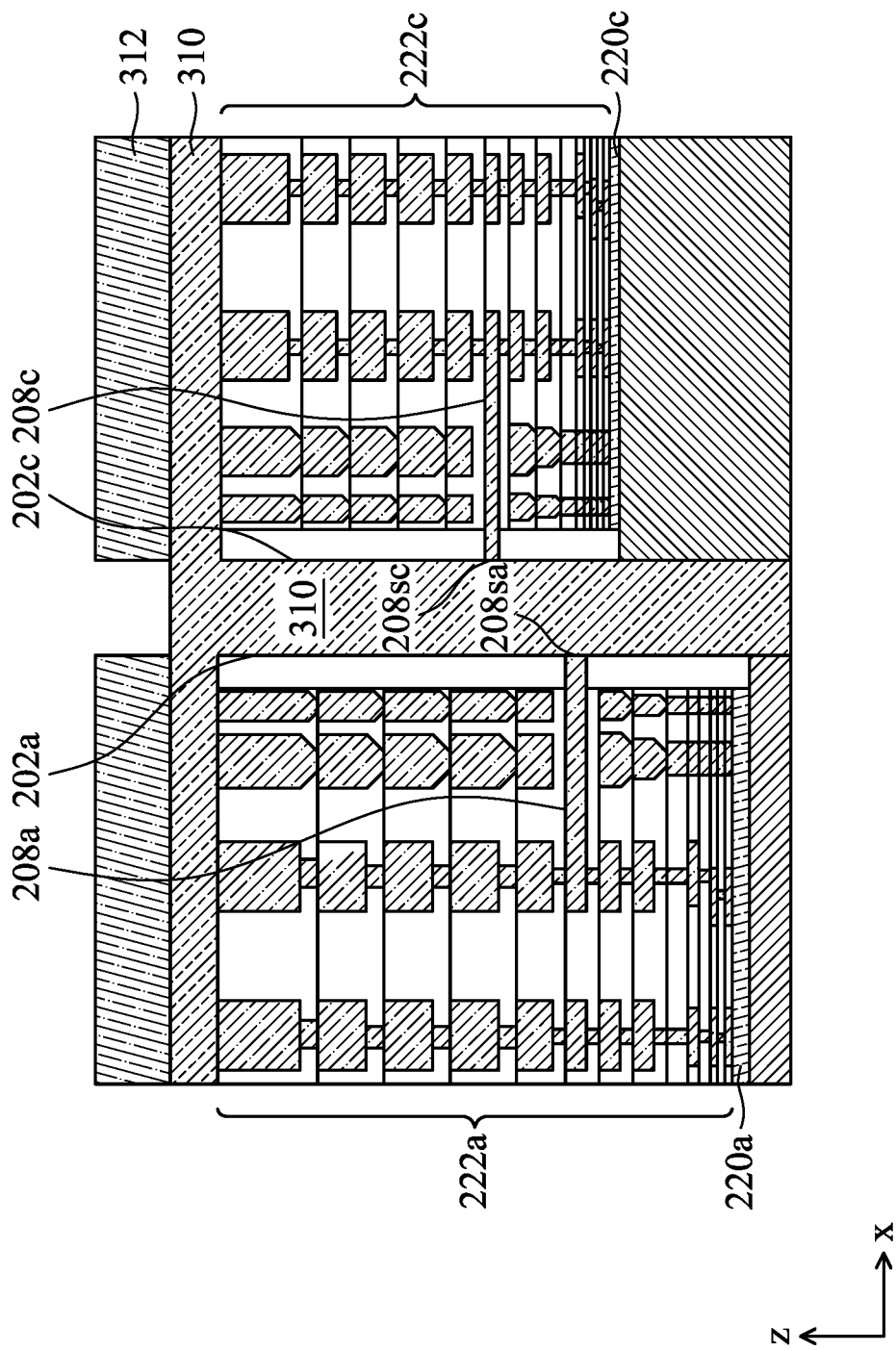

After the integrated circuit dies 200a, 200b, 200c are attached to the carrier substrate 302, a dielectric layer is formed to cover the integrated circuit dies 200a, 200b, 200c and fill the gaps 308 therebetween, as shown in FIGS. 4A-4B. FIG. 4A schematic cross-sectional view of the semiconductor package 300. FIG. 4B is a partial enlarged view of the area 4B in FIG. 4A.

The dielectric layer 310 may be formed, for example, of a low dielectric constant (low-K) dielectric material, such as SiOx, SiOxCyHz, $SiO_xC_y$, SiCx, SiNx, or related low-k dielectric material, compounds thereof, composites thereof, combinations thereof, or the like. The dielectric layer 310 may be formed by any suitable method, such as spinning, chemical vapor deposition (CVD), and/or plasma-enhanced CVD (PECVD).

A hard mask layer 312 may be formed over the dielectric layer 310 by a suitable deposition process. A patterning process is then performed to expose the dielectric layer 310 corresponding to the gaps 308 wherein inter-chip connections are to be formed. The hard mask layer 312 may be any suitable material. In some embodiments, the hard mask layer 312 may be made of oxide, nitride, or a combination of oxide and nitride.

Figure 5A:
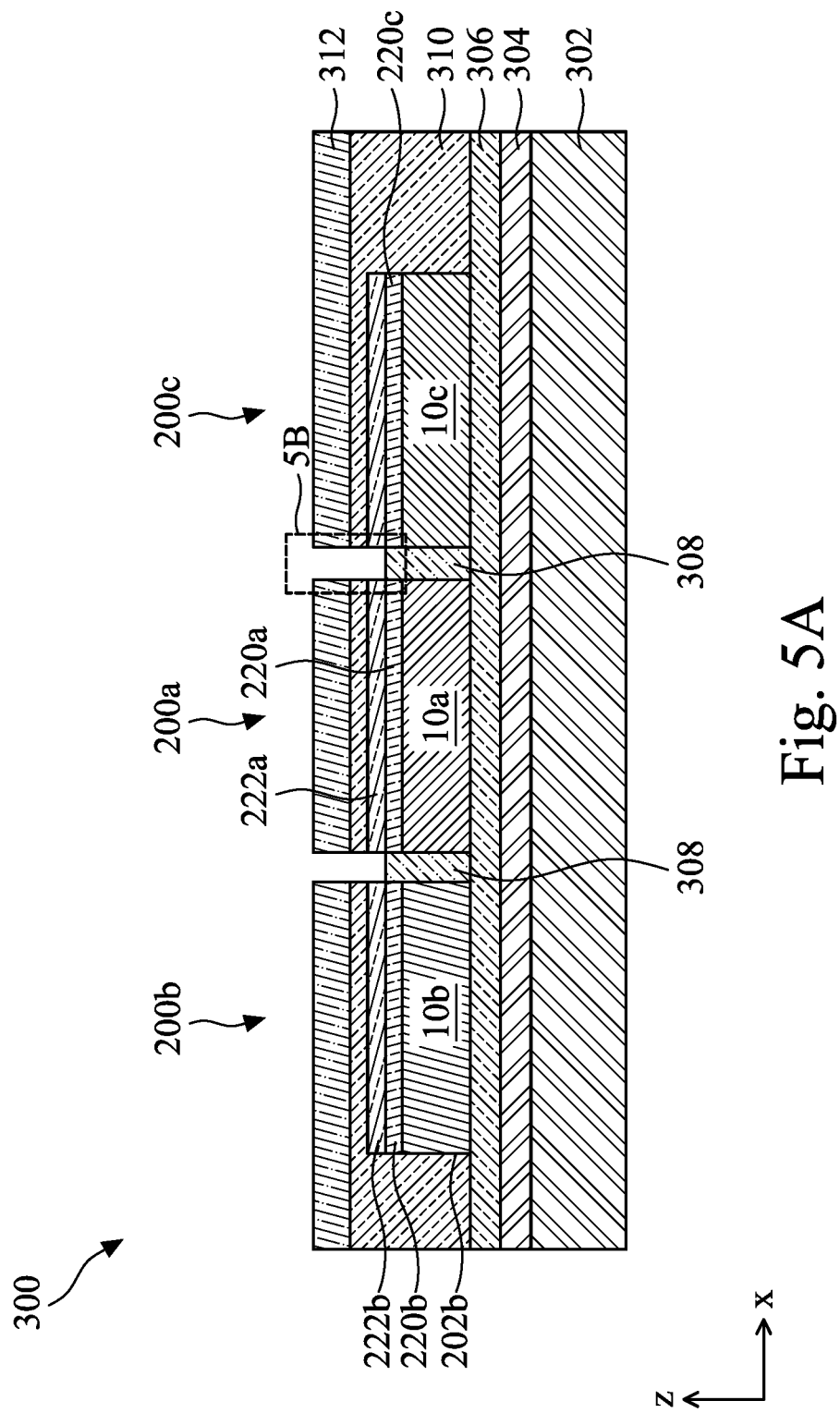
Figure 5B:
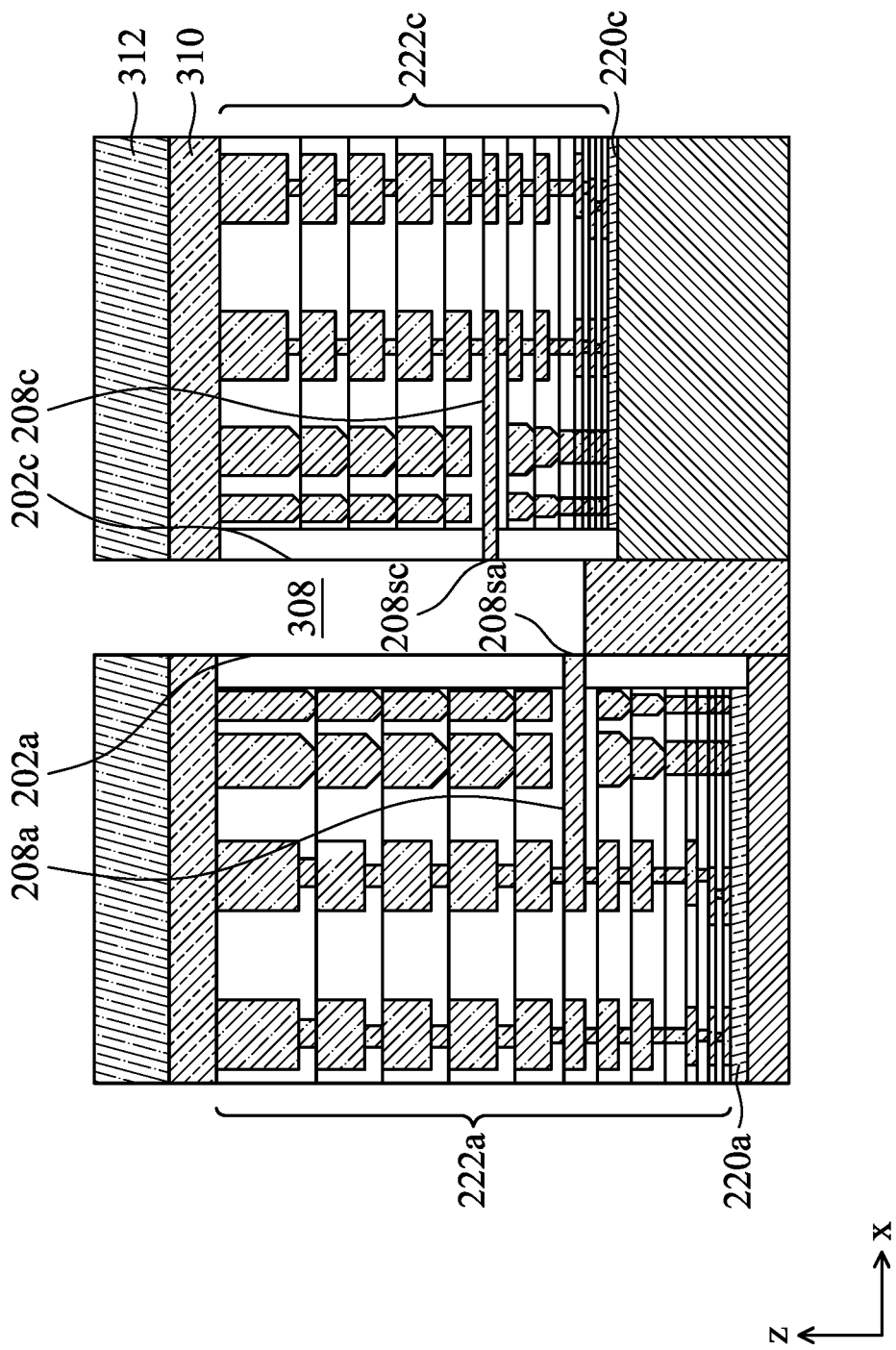

After patterning of the hard mask layer 312, the exposed dielectric layer 310 is etched back to expose the cross-sectional surfaces 208s, the as shown in FIGS. 5A-5B. FIG. 5A schematic cross-sectional view of the semiconductor package 300. FIG. 5B is a partial enlarged view of the area 5B in FIG. 5A. A suitable etch process may be performed to etch back the dielectric layer 310 exposed by the hard mask layer 312. Suitable etching processes include dry etching, wet etching, reactive ion etching, and/or other etching methods. As shown in FIG. 5B, the dielectric layer 310 is etched back to a level that the edge interconnect features 208a, 208c on both sides of the gap 308 are exposed.

Figure 5C:
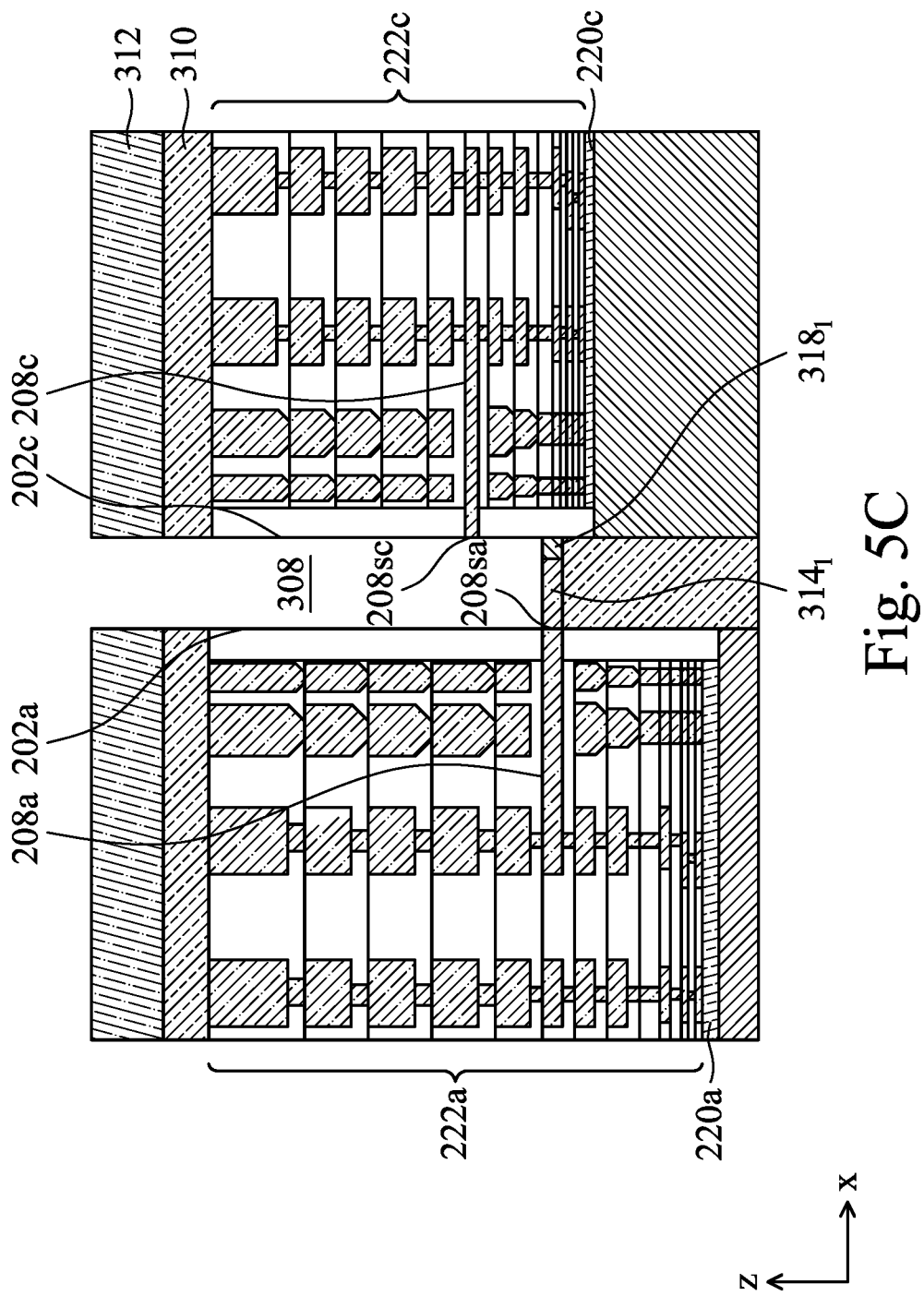
Figure 5D:
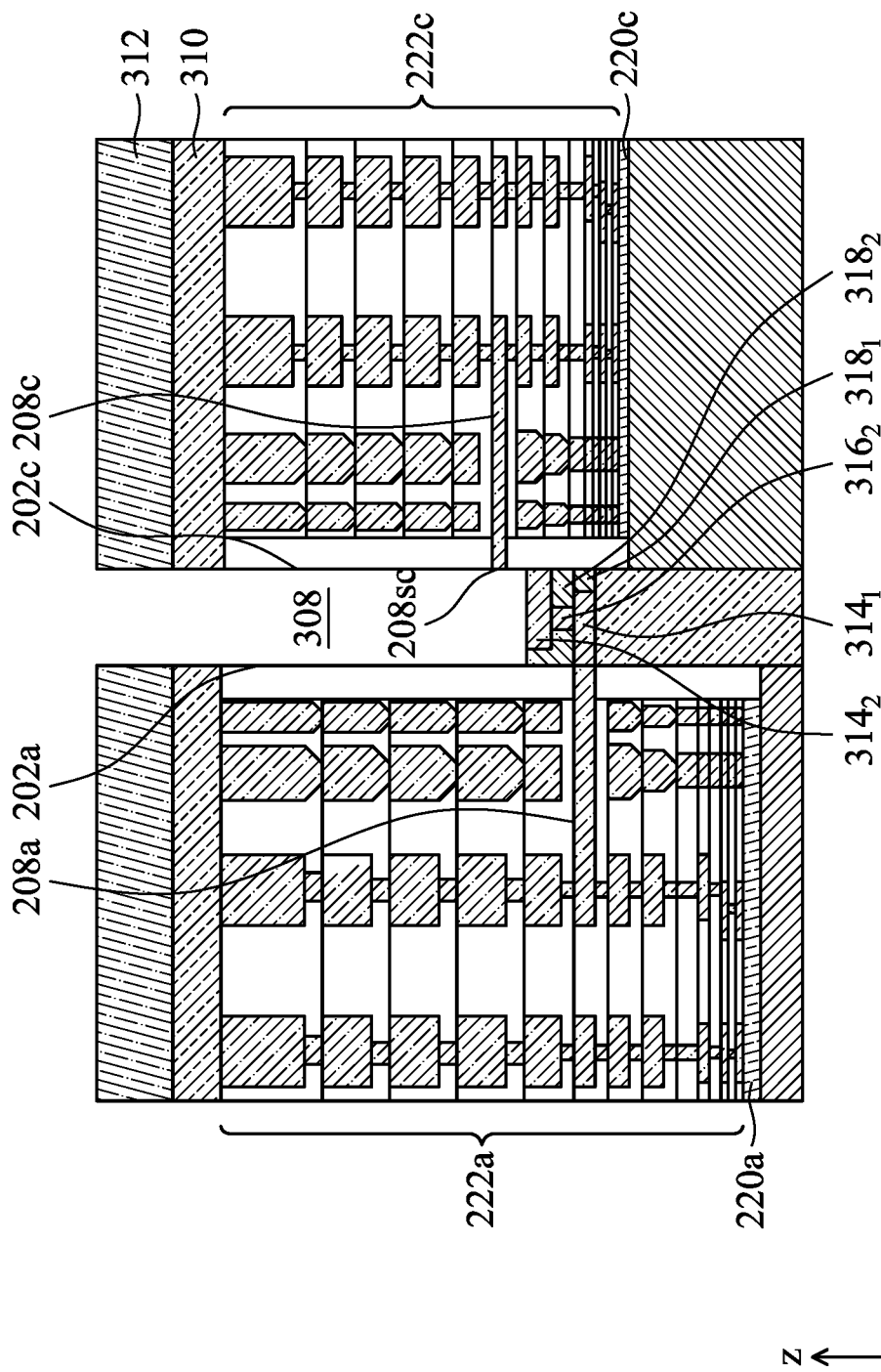
Figure 5E:
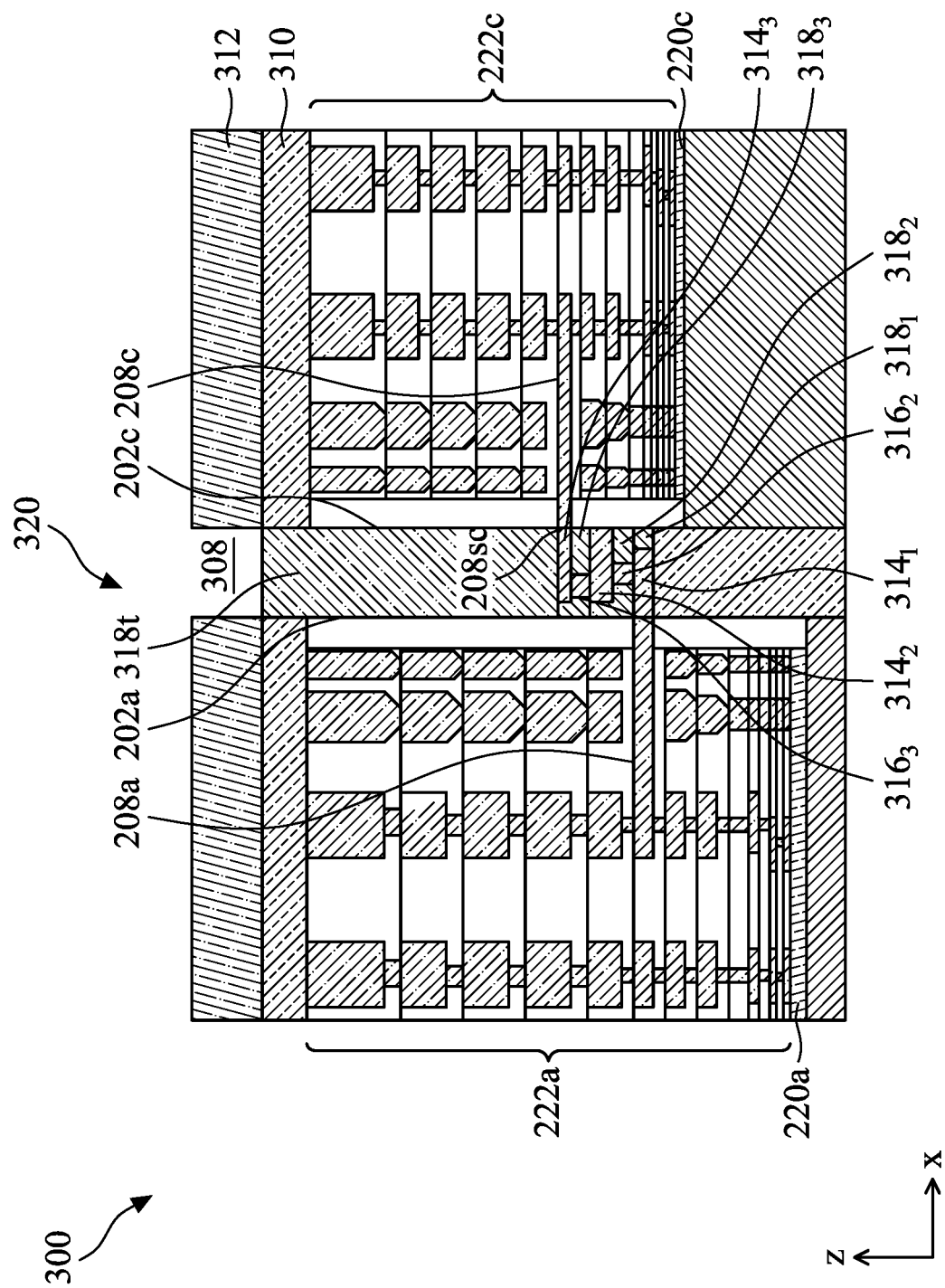

One or more conductive features, such as conductive features 314, 316 as shown in FIGS. 5C-5E, are then formed in the gap 308 to form electrical communication paths between the edge interconnect features 208a, 208b, 208c to be connected. FIGS. 5C-5E are schematic enlarged views of the area 5B in FIG. 5A during various stages of forming conductive features 314, 316 between the edge interconnect features 208a, 208c according to some embodiments of the present disclosure.

In some embodiments, the conductive features 314, 316 may be conductive lines and conductive vias embedded in one or more dielectric layers 318. For example, the conductive features 314 may be conductive lines at various levels, i.e. formed in different dielectric layers 318, and the conductive features 316 may be conductive vias connecting conductive lines in different levels. In some embodiments, the conductive features 314, 316 may be formed in the dielectric layers 318 layer-by-layer in a bottom-up manner, similar to the process used to form the interconnect structures 122 in the BEOL process. In some embodiments, a damascene process may be performed for to form the conductive features 314, 316 in each dielectric layer 318.

In some embodiments, two or more conductive features 314, 316 formed at different levels and embedded in different dielectric layers 318 may be used to connect the edge interconnect features located at different levels. In other embodiments, two or more conductive features 314, 316 located at various levels may be used to enable formation of crisscross connection paths between the edge interconnect features. In some embodiments, the edge interconnect features 208a, 208c may be positioned at the same level, and the two or more conductive features 314, 316 may be formed at the same level to connect the edge interconnect features 208a, 208c.

The conductive features 314, 316 may be formed from one or more electrically conductive materials, such as one or more layers of graphene, metal, metal alloy, metal nitride, or silicide. For example, the conductive features 314, 316 are made from a metal, such as Cu, Al, Co, Ru, Mo, W, related alloys thereof, or a combination thereof. The dielectric layer 318 includes one or more dielectric materials to provide isolation functions to various conductive features 314, 316. The dielectric layer 318 may include multiple dielectric layers embedding multiple levels of conductive features 314, 316. The dielectric layers 318 may be made from a dielectric material, such as $SiO_x$, $SiO_xC_yH_z$, or $SiO_xC_y$, where x, y and z are integers or non-integers. In some embodiments, the dielectric layer 318 include a low-k dielectric material having a k value less than that of silicon oxide. In some embodiments, the dielectric layer 318 has a k value ranging from about 1.5 to about 3.9.

In some embodiments, a barrier layer (not shown) may be formed between the conductive features 314, 316 and the dielectric layer 318. The barrier film may be formed from one or more layers of nitride material, such as titanium nitride, tantalum nitride, tungsten nitride, molybdenum nitride, or other related nitrides, such as titanium silicon nitride, tungsten silicon nitride, or other suitable material.

FIGS. 5C-5E schematically illustrate various stages of forming electrical paths between the edge interconnect features 208a of the integrated circuit die 208a to the edge interconnect feature 208c of the integrated circuit die 208c. In the example shown in FIG. 5C, the edge interconnect feature 208a is at a lower position in the z-direction than the edge interconnect feature 208c, thus, a conductive feature $314_1$, which is in direct contact with the edge interconnect feature 208a, is first formed, as shown in FIG. 5C. In some embodiments, the conductive feature $314_1$ may be formed by depositing a dielectric layer $318_1$, patterning the dielectric layer $318_1$ to form a line opening to expose the cross-sectional surfaces 208sa, and filling the line opening with a conductive material.

The conductive feature $314_1$ may be formed by any suitable deposition methods, for example, by electroless deposition or by an atomic layer deposition (ALD) or by chemical vapor deposition (CVD). In some embodiments, a selective deposition may be used to form at least a portion of the conductive feature $314_1$. In some embodiments, the exposed cross-sectional surface 208sa acts as catalyst or a seed layer for a selective deposition process. The selective deposition ensures a quality connection between the edge interconnect feature 208a and the conductive feature $314_1$.

In some embodiments, the conductive features $314_1$ may be at least partially formed by an electroless deposition process. The electroless deposition may be performed in a plating solution having a pH value in a range between about 2.0 and about 11.0. The electroless plating may be performed in a temperature range between room temperature and about 180° C. The electroless deposition solution may comprise reactant including metal-organic and metal-halide structures, such as Metal-CxHyOz, Metal-CxNyHz, Metal-CxOy, Metal-NxHy, Metal-Fx, Metal-Clx, Metal-Brx, the like, and a combination thereof. The metal may include Cu, Co, Ru, Mo, W, Ir, Fe, Ni, Ag, Sn, alloys thereof, or a combination thereof. The electroless deposition solution may be a water-based solution or a solvent-based solution. When a solvent-based solution is used, the process temperature may be performed between room temperature to about 180° C.

In other embodiments, the conductive feature $314_1$ may be formed by selective ALD, CVD process, for example by plasma enhanced ALD, plasma enhanced CVD, thermal ALD, or thermal CVD. Particularly, selective ALD/CVD may be achieved through surface reaction, surface state such as H-termination and surface free electron, and the sacrificial solid-state co-reactant. In some embodiments, selective deposition is enabled by catalytic behavior of a metal surface which promotes precursor reduction. The ALD/CVD process may be performed at a pressure range between about 500 mtorr and about 1 atm. The ALD/CVD may be performed in a temperature range between room temperature and about 550° C. The ALD/CVD process precursors may include metal-organic and metal-halide structures, such as Metal-CxHyOz, Metal-CxNyHz, Metal-CxOy, Metal-NxHy, Metal-Fx, Metal-Clx, Metal-Brx, the like, and a combination thereof. The metal may include Cu, Co, Ru, Mo, W, Ir, Fe, Ni, Ag, Sn, alloys thereof, or a combination thereof. In some embodiments, selective ALD may be performed by forming a catalytic contribution of surface free electrons on exposed metal surface and then selective reaction between the terminated hydrogen and the methyl radical of metal-halide structure. In another embodiment, selective CVD is performed to form cobalt on exposed edge interconnect features 208 from dicobaltoctacarbonyl and trimethylphosphine.

In FIG. 5D, conductive features $314_2$, $316_2$ are formed over the conductive feature $314_1$. The conductive feature $316_2$ may be a conductive via and the conductive feature $314_2$ may be a conductive line. The conductive feature $316_2$ connects between the conductive features $314_1$ and $314_2$. The conductive features $314_2$, $316_2$ may be formed by depositing a dielectric layer $318_2$, patterning the dielectric layer $318_2$ to form a line opening and a via opening to expose the conductive feature $314_1$, and filling the line opening and the via opening with a conductive material. The conductive features $314_2$, $316_2$ may be formed using in a similar manner as formation of the conductive feature $314_1$.

In FIG. 5E, conductive features $314_3$, $316_3$ are formed over the conductive feature $314_2$. The conductive feature $316_3$ may be a conductive via and the conductive feature $314_3$ may be a conductive line. The conductive feature $316_3$ connects between the conductive features $314_2$ and $314_3$. The conductive features $314_3$, $316_3$ may be formed by depositing a dielectric layer $318_3$, patterning the dielectric layer $318_3$ to form a line opening which exposes the cross-sectional surface 208sc and a via opening which exposes the conductive feature $314_2$, and filling the line opening and the via opening with a conductive material. The conductive features $314_3$, $316_3$ may be formed using in a similar manner as formation of the conductive feature $314_1$. In some embodiments, a selective deposition may be used to form at least a portion of the conductive feature $314_3$. In some embodiments, the exposed cross-sectional surface 208sc acts as catalyst or a seed layer for a selective deposition process. The selective deposition ensures a quality connection between the edge interconnect feature 208c and the conductive feature $314_3$.

In some embodiments, the conductive features 314, 316 may be a line width in a range between 0.01 μm and about 6 μm, and a line depth in a range between 0.01 μm and about 6 μm. A line width or line depth less than 0.01 μm may not provide reliable electrical connection between the edge interconnect features 208a, 208b, 208c. A line width or line depth greater than 12 μm may not leave enough space between the conductive features causing short circuit.

In some embodiments, an inter-chip RDL structure 320 is completed when a top dielectric layer 318t is formed over the conductive features 314, 316 after the edge interconnect features 208a, 208b, 208c are connected as designed, as shown in FIG. 5E.

Figure 6A:
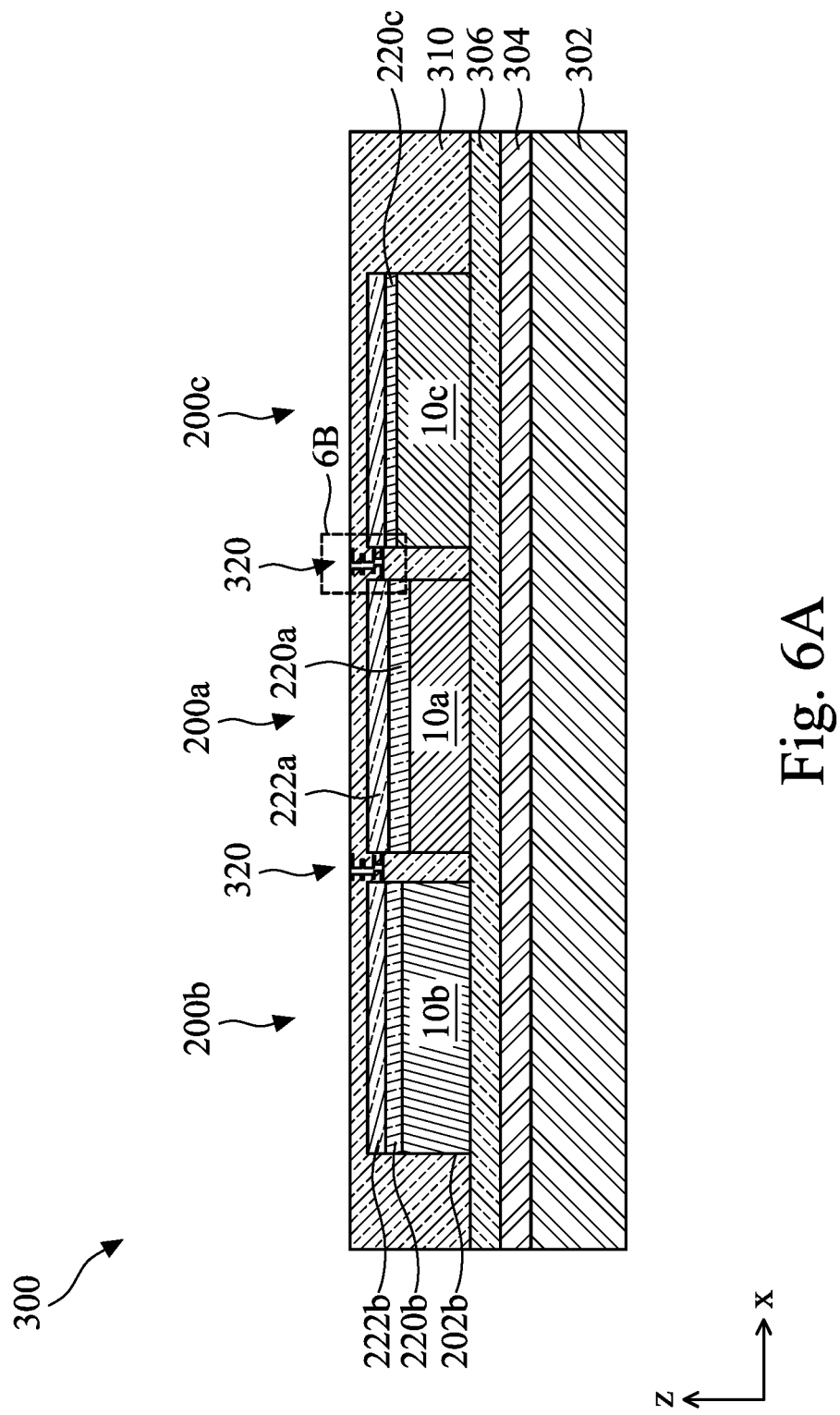
Figure 6B:
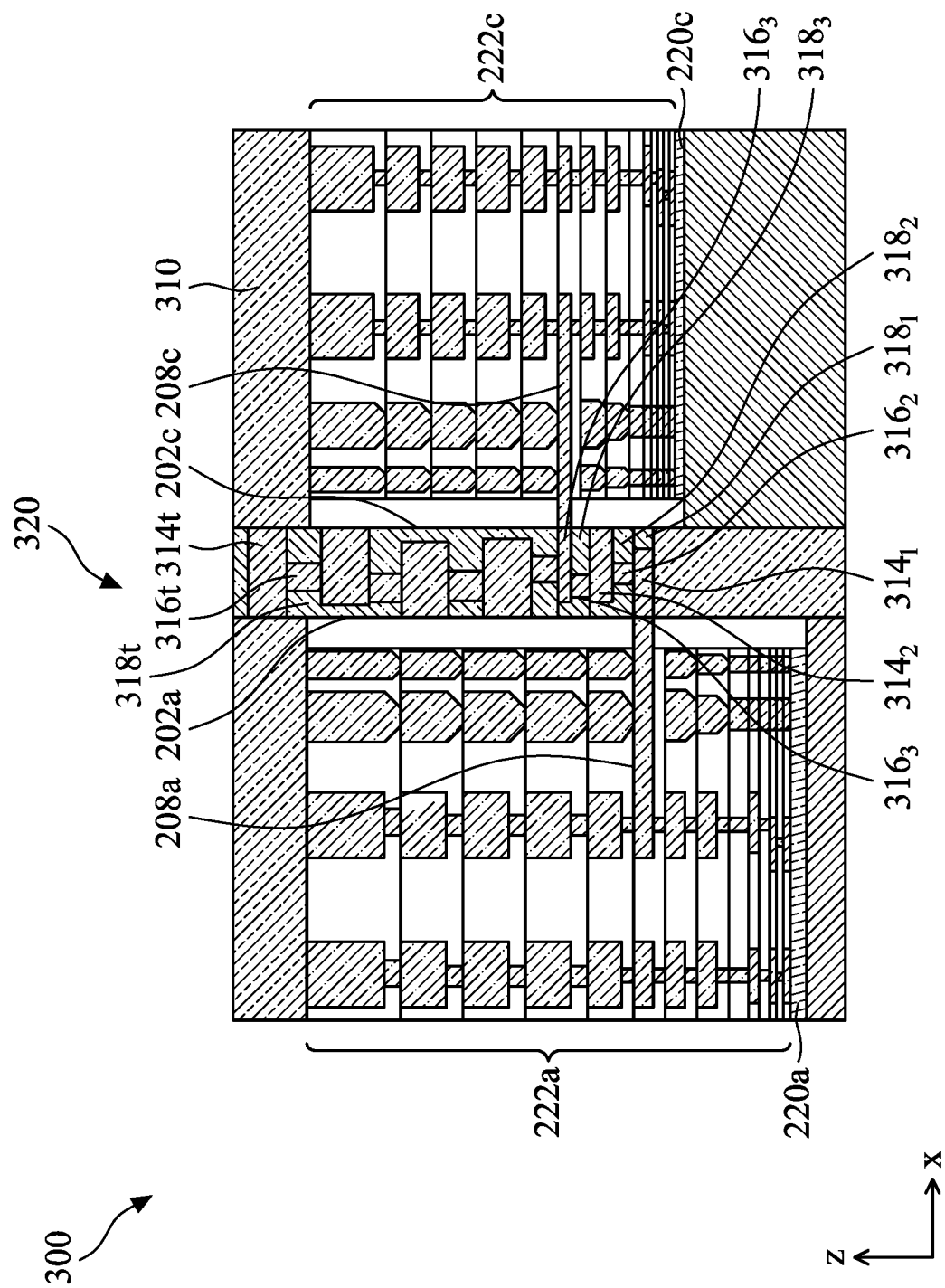

After formation of the inter-chip RDL structure 320, the hard mask layer 312 may then be removed from the semiconductor package 300 for subsequent processing as shown in FIGS. 6A-6B. FIG. 6A is a schematic cross-sectional view of the semiconductor package 300. FIG. 6B is a partial enlarged view of the area 6B in FIG. 6A. The inter-chip RDL structure 320 connects two adjacent integrated circuit dies 200a, 200b, 200c without going through any interposer, external connectors, or printed circuit boards (PCBs). Using the inter-chip RDL structures 320 can reduce the number of bumping processes during multi-chip integration. The inter-chip RDL structure 320 and the edge interconnect features 208a, 208b, 208c are formed in the IMD layer level, thus, with higher routing density than bumping connectors formed on or above redistribution layer.

In some embodiment, the inter-chip RDL structure 320 may also be used to provide power to the integrated circuit die 200a, 200b, 200c through the edge interconnect features 208a, 208b, 208c. Providing power through the edge interconnect features 208a, 208b, 208c, instead of going through interposers, substrate, or PCB, can reduce power consumption and achieve higher performance.

In some embodiments, additional conductive features 314t, 316t may be formed in the inter-chip RDL structure 320 above the edge interconnect features 208a, 208b, 208c, as shown in FIG. 6B. In some embodiments, the additional conductive features 314t, 316t, may be used to connect the edge interconnect features 208a, 208b, 208c to external contacts, for example, to provide power supply.

Figure 7A:
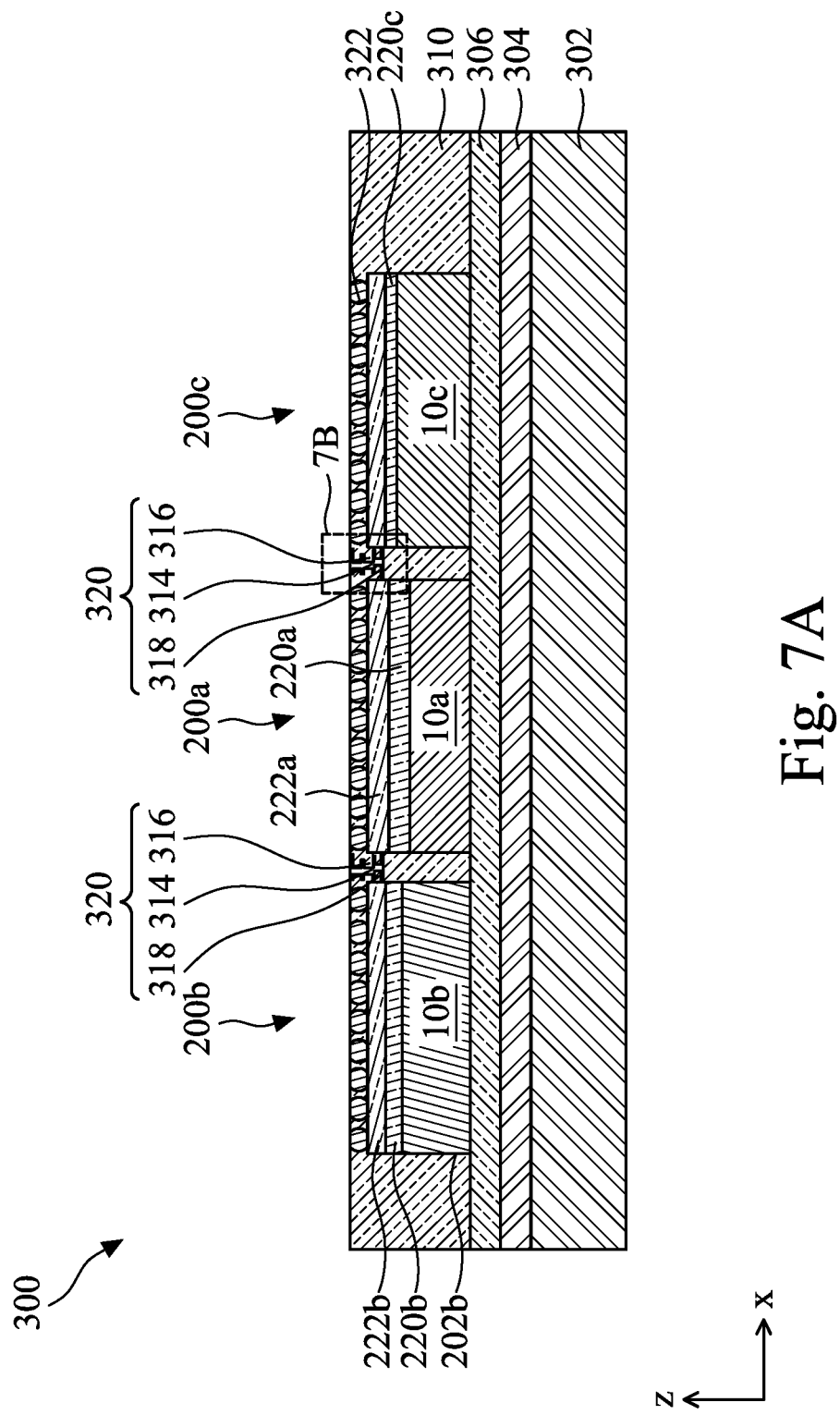
Figure 7B:
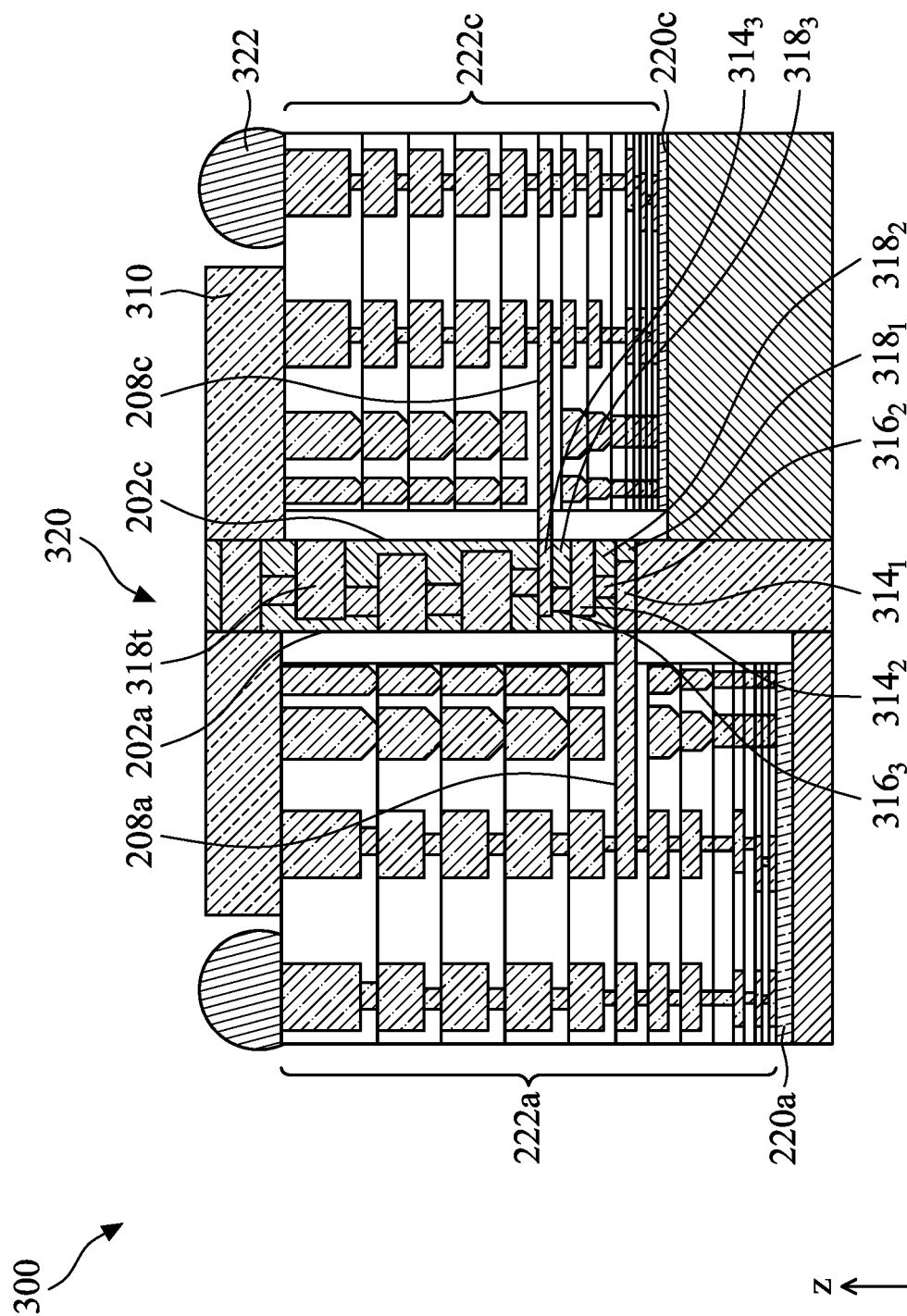

After the hard mask layer 312 is removed, the dielectric layer 310 may be partially removed to expose the integrated circuit dies 200a, 200b, 200c and form external contacts 322 thereon, as shown in FIGS. 7A and 7B. FIG. 7A is a schematic cross-sectional view of the semiconductor package 300. FIG. 7B is a partial enlarged view of the area 7B in FIG. 7A.

The external contacts 322 may be formed on the integrated circuit dies 200a, 200b, 200c, for example, by a bumping process. The external contacts 322 may be, e.g., conductive pillars such as a copper pillars or copper posts. In some embodiments, the external contacts 322 may be solder bumps, copper bumps, or other suitable external contacts that may be made to provide electrical connection from the integrated circuit dies 200a, 200b, 200c to other external devices. All such external contacts are fully intended to be included within the scope of the embodiments. As the inter-chip RDL structure 320 provides internal connections between or among the integrated circuit dies 200a, 200b, 200c, the external contacts 322 may be used to provide external connections to the integrated circuit dies 200a, 200b, 200c. In some embodiments, the external contacts 322 may be formed over the inter-chip RDL structure 320 to provide additional connection to the edge interconnect features 208a, 208b, 208c through the inter-chip RDL structure 320.

Figure 8:
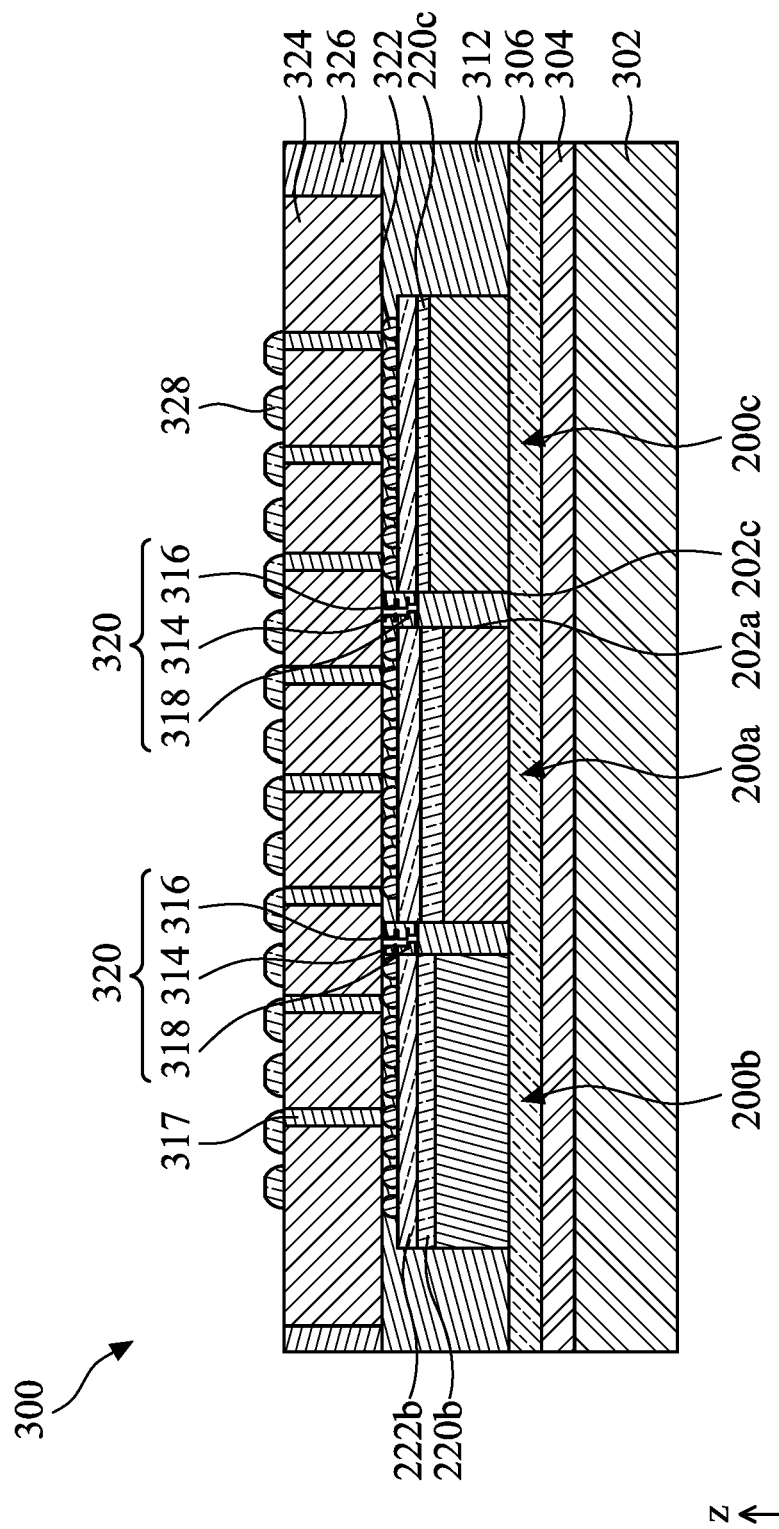

In some embodiments, the external contacts 322 may be used to connect with a printed wiring board or printed circuit board (PCB) to form an electronic assembly. In other embodiments, an optional interposer substrate 324 may be attached to the external contacts 322 by a bumping process, as shown in FIG. 8. FIG. 8 schematic cross-sectional view of the semiconductor package 300. The interposer substrate 324 may include various embedded interconnections, which may provide routes from the external contacts 322 to external circuits, such as a PCB.

An encapsulant layer 326 may then be formed over the interposer substrate 324. The encapsulant layer 326 may be a molding compound, epoxy, or the like, and may be applied by compression molding, lamination, transfer molding, or the like. The encapsulant layer 326 may be formed over the interposer substrate 324 such that the external contacts 322 are buried or covered. The encapsulant layer 326 may then be cured.

In some embodiments, the encapsulant layer 326 may undergo a grinding process to expose conductive features on the interposer substrate 324. External connectors 328 are then formed on the interposer substrate 324. The external connectors 328 may be used to connect the semiconductor package 300 to a PCB to form an electronic assembly. In some embodiments, through substrate vias or TSVs 317 extend vertically through the interposer substrate 324 and electrically connect the external connectors 328 and the external contacts 322. In some embodiments, the TSVs 317 may be through silicon vias where a silicon substrate material is used. TSVs 317 may be made of any suitable conductive material commonly used in the art for such vias, including without limitation tungsten, copper, nickel, or alloys thereof. In some representative embodiments, TSVs 317 may have a representative diameter, without limitation, of about 5 microns to about 12 microns depending on the design requirement and process used to form the TSVs 317.

Figure 9:
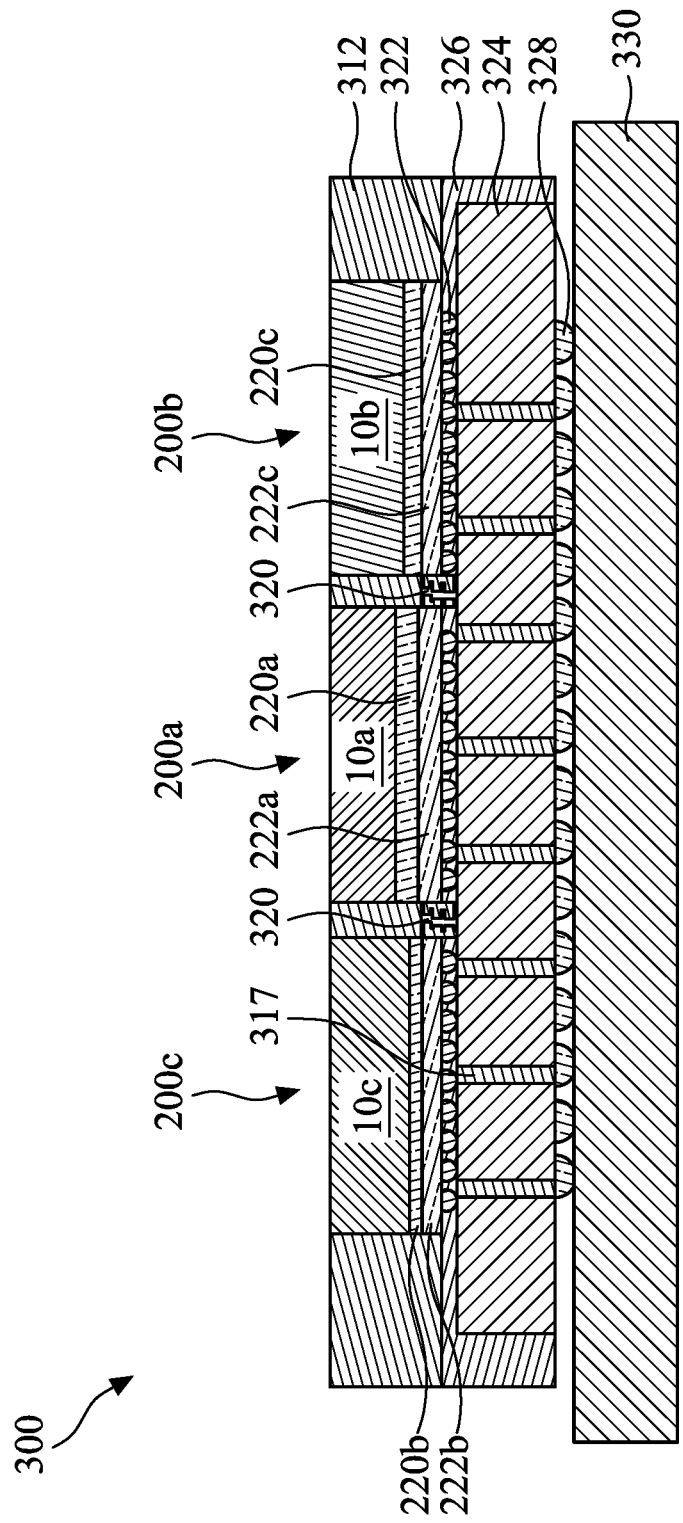

FIG. 9 schematic cross-sectional view of the semiconductor package 300 attached to a PCB 330, with the carrier substrate 302 along with the adhesive layer 304 and the die attach film 306 removed. The PCB 330 may be part of an electronic assembly can be part of an electronic system such as computers, wireless communication devices, computer-related peripherals, entertainment devices, or the like.

Even though three integrated circuit dies 200a, 200b, 200c are shown in the semiconductor package 300, less or more integrated circuit dies with edge interconnect features may be packaged together according to circuit design.

Even though the integrated circuit dies 200a, 200b, 200c in the semiconductor package 300 have substantially the same shape and the dimension, integrated circuit dies of different dimension and/or shape may be included in the semiconductor packages so along as edge interconnect features in different integrated circuit dies to be connected may be aligned for connection.

Embodiments of the present disclosure provide an integrated circuit die with edge interconnect features extending from one or more IMD layers to a side surface of the integrated circuit die. The edge interconnect features of different integrated circuit dies may be connected by an inter-chip RDL structure to enable direct connection between the integrated circuit dies. The inter-chip RDL structure includes internal routings, thus provide design flexibility, and also allows direct inter-chip connection between integrated circuit dies with different dimensions and/or different edge interconnect arrangements. The direct connection between different integrated circuit dies reduces interposer layers, redistribution process, and bumping processes in multi-die integration, thus, reducing cost of manufacturing. The edge interconnect features also enable power to be directly transferred therethrough, instead of going through interposer substrates, or PCBs, thus achieve higher performance. The edge interconnect features, connected to one or more IMD layers, also enables higher routing density than through an interposer. The edge interconnect features design may be easily adopted from one integrated circuit die to another, thus, provide high feasibility and flexibility for designers.

Some embodiments of the present provide a semiconductor package comprising a first integrated circuit die comprising a first edge interconnect feature, a second integrated circuit die comprising a second edge interconnect feature, wherein the first integrated circuit die and the second integrated circuit die are positioned side-by-side, and an inter-chip RDL structure formed between the first integrated circuit die and the second integrated circuit die, wherein the inter-chip RDL structure comprises a first conductive feature in contact with the first edge interconnect feature, and a second conductive feature in contact with the second edge interconnect feature.

Some embodiments of the present disclosure provide a semiconductor package. The semiconductor package includes a substrate, a first integrated circuit die attached to the substrate, a second integrated circuit die attached to the substrate adjacent the first integrated circuit die, and a RDL structure formed between the first integrated circuit die and the second integrated circuit die, wherein the RDL structure comprises one or more first conductive features extending from the first integrated circuit die, and one or more second conductive features extending from the second integrated circuit die.

Some embodiments of the present disclosure provide a method for forming a semiconductor device. The method includes forming a first integrated circuit die having a first edge interconnect feature, wherein the first edge interconnect feature is exposed on a first cutting surface of the first integrated circuit die, forming a second integrated circuit die having a second edge interconnect feature, wherein the second edge interconnect feature is exposed on a second cutting surface on the second integrated circuit die, positioning the first and second integrated circuit dies adjacent to each other such that the first cutting surface faces the second cutting surface, and forming a RDL structure between the first cutting surface and the second cutting surface, wherein the RDL structure includes two or more conductive features in electrical connection with the first edge interconnect feature and the second edge interconnect feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor package, comprising:
   a first integrated circuit die comprising a first edge interconnect feature formed over a first substrate, wherein the first edge interconnect features extends to a first surface of the first integrated circuit die;
   a second integrated circuit die comprising a second edge interconnect feature formed over a second substrate, wherein the second edge interconnect feature extends to a second surface of the second integrated circuit die, and the first integrated circuit die and the second integrated circuit die are positioned side-by-side with a gap between the first surface and the second surface; and
   an inter-chip RDL structure formed in the gap between the first integrated circuit die and the second integrated circuit die, wherein the inter-chip RDL structure comprises:
      a first dielectric layer disposed between the first substrate and the second substrate;
      a first conductive feature in contact with the first edge interconnect feature; and
      a second conductive feature in contact with the second edge interconnect feature.

2. The semiconductor package of claim 1, wherein the inter-chip RDL structure further comprises:
   One or more second dielectric layers disposed between the first surface and the second surface, wherein the one or more second dielectric layer are disposed over the first dielectric layer, and the first conductive feature and second conductive feature are embedded in the one or more second dielectric layers.

3. The semiconductor package of claim 2, wherein the first conductive feature and the second conductive feature are conductive lines formed in different second dielectric layers, and the third conductive feature is a conductive via.

4. The semiconductor package of claim 1, wherein the first integrated circuit die further comprises a first interconnect structure, and the first edge interconnect feature is connected to the first interconnect structure.

5. The semiconductor package of claim 4, wherein the first interconnect structure comprises:
   an IMD (inter metal dielectric) layer; and
   a conductive feature embedded in the IMD layer, wherein an inner end of the first edge interconnect feature is connected to the conductive feature, and an outer end of the first edge interconnect feature extends to the first surface of the first integrated circuit die.

6. The semiconductor package of claim 5, wherein the first interconnect structure further comprises a sealing ring, and the first edge interconnect feature extends through an opening in the sealing ring.

7. The semiconductor package of claim 1, wherein the first interconnect feature and the second interconnect feature are at different levels.

8. A semiconductor package, comprising:
   a substrate;
   a first integrated circuit die attached to the substrate;
   a second integrated circuit die attached to the substrate adjacent the first integrated circuit die, wherein the first integrated circuit die and the second integrated circuit die are positioned side-by-side with a gap in between; and
   a RDL structure formed in the gap between the first integrated circuit die and the second integrated circuit die, wherein the RDL structure comprises:
      one or more first conductive features extending from the first integrated circuit die; and
      one or more second conductive features extending from the second integrated circuit die, wherein the first and second integrated circuit dies are individual dies separated by the RDL structure.

9. The semiconductor package of claim 8, wherein the first integrated circuit die comprises:
   a first interconnect structure; and
   one or more first edge interconnect features extending from the first interconnect structure to a first surface, wherein each of the one or more first edge interconnect features is in contact with one of the first conductive features in the RDL structure.

10. The semiconductor package of claim 9, wherein the first integrated circuit die further comprises:
    a sealing ring formed around the first interconnect structure, and the one or more first edge interconnect features extend through in the sealing ring.

11. The semiconductor package of claim 9, wherein the second integrated circuit die comprises:
    a second interconnect structure; and
    one or more second edge interconnect features extending from the second interconnect structure to a second surface, wherein each of one or more second edge interconnect features is in contact with one of the second conductive features in the RDL structure.

12. The semiconductor package of claim 11, wherein the one or more first edge interconnect features and the one or more second edge interconnect features are formed at different levels.

13. The semiconductor package of claim 11, wherein the one or more first edge interconnect features and the one or more second edge interconnect features are distributed at different intervals.

14. The semiconductor package of claim 8, wherein the RDL structure further comprises:

one or more dielectric layers, wherein the one or more first conductive features and the one or more second conductive features are embedded in the one or more dielectric layers.

15. A method for forming a semiconductor device, comprising:
    forming and cutting a first integrated circuit die into an individual die, wherein the first integrated circuit die has a first cutting surface, and a first edge interconnect feature is exposed on the first cutting surface of the first integrated circuit die;
    forming and cutting a second integrated circuit die into an individual die, wherein the second integrated circuit die has a second cutting surface, and a second edge interconnect feature is exposed on the second cutting surface on the second integrated circuit die;
    positioning the first and second integrated circuit dies adjacent to each other on a carrier substrate such that the first cutting surface faces the second cutting surface; and
    forming a RDL structure between the first cutting surface and the second cutting surface, wherein the RDL structure includes two or more conductive features in electrical connection with the first edge interconnect feature and the second edge interconnect feature.

16. The method of claim 15, wherein forming the RDL structure comprises:
    depositing a dielectric layer between the first cutting surface and the second cutting surface;
    forming an opening in the dielectric layer to expose the first edge interconnect feature; and
    selectively depositing a conductive material on the first edge interconnect feature.

17. The method of claim 16, wherein selectively depositing the conductive material performing one of an electroless deposition, atomic layer deposition, and chemical vapor deposition.

18. The method of claim 15, wherein forming the first integrated circuit die comprises:
    forming a device layer including one or more semiconductor devices; and
    forming an IMD layer over the device layer, wherein the IMD layer includes the first edge interconnect feature.

19. The method of claim 18, where forming the first integrated circuit die further comprises:
    forming a sealing ring in the IMD layer adjacent a perimeter of the first integrated circuit die, wherein the sealing ring has an opening, and the first edge interconnect feature extends through the opening.

20. The semiconductor of claim 1, wherein the first conductive feature and the second conductive feature are embedded in the first dielectric layer.

* * * * *